United States Patent [19]
Keller et al.

[11] Patent Number: 5,651,900
[45] Date of Patent: Jul. 29, 1997

[54] MICROFABRICATED PARTICLE FILTER

[75] Inventors: Christopher G. Keller, Albany; Mauro Ferrari, Walnut Creek, both of Calif.

[73] Assignee: The Regents of the University of California, Oakland, Calif.

[21] Appl. No.: 207,457

[22] Filed: Mar. 7, 1994

[51] Int. Cl.$^6$ .................... C03C 15/00; B01D 67/00
[52] U.S. Cl. .............. 216/56; 210/490; 210/500.26; 427/244; 427/585
[58] Field of Search .............. 96/11; 210/321.84, 210/490, 500.25, 500.26, 335, 506, 615; 264/41, 42, 45.1; 156/630.1, 632.1, 628.1; 65/31; 422/101; 435/311; 216/56; 427/244, 535, 245

[56] References Cited

U.S. PATENT DOCUMENTS

| | | | |
|---|---|---|---|
| 2,226,381 | 12/1940 | Norris | 216/56 |
| 2,226,383 | 12/1940 | Norris | 216/56 |
| 2,226,384 | 12/1940 | Norris | 216/56 |
| 2,246,380 | 6/1941 | Norris | 216/56 |
| 3,329,541 | 7/1967 | Mears | 216/56 |
| 3,502,455 | 3/1970 | Gardner | 65/31 |
| 3,600,147 | 8/1971 | McKinnis et al. | 65/31 |
| 3,962,052 | 6/1976 | Abbas et al. . | |
| 4,063,271 | 12/1977 | Bean et al. . | |
| 4,077,885 | 3/1978 | van Heuven et al. | 210/193 |
| 4,177,228 | 12/1979 | Prölss | 264/24 |
| 4,307,507 | 12/1981 | Gray et al. . | |
| 4,369,565 | 1/1983 | Muramatsu . | |
| 4,473,476 | 9/1984 | McMillan et al. | 210/653 |
| 4,689,150 | 8/1987 | Abe et al. | 210/490 |
| 4,698,900 | 10/1987 | Esquivel . | |
| 4,797,175 | 1/1989 | Ellion et al. | 216/56 |
| 4,797,211 | 1/1989 | Ehrfeld et al. | 210/500.25 |
| 4,814,083 | 3/1989 | Ford et al. | 210/500.25 |
| 4,853,001 | 8/1989 | Hammel | 65/31 |
| 4,874,484 | 10/1989 | Foell et al. . | |
| 4,981,590 | 1/1991 | Veen et al. | 210/490 |
| 5,126,810 | 6/1992 | Gotou . | |
| 5,131,978 | 7/1992 | O'Neill . | |
| 5,160,617 | 11/1992 | Veld et al. | 210/490 |
| 5,234,594 | 8/1993 | Tonucci et al. | 210/500.26 |
| 5,238,613 | 8/1993 | Anderson | 264/22 |
| 5,262,021 | 11/1993 | Lehmann et al. . | |
| 5,271,801 | 12/1993 | Valette . | |
| 5,275,766 | 1/1994 | Gadkaree et al. | 65/31 |

FOREIGN PATENT DOCUMENTS

| | | | |
|---|---|---|---|
| 1-138110 | 5/1989 | Japan . | |
| 1680270 | 9/1991 | U.S.S.R. | 210/506 |
| 89/08489 | 9/1989 | WIPO . | |
| 92/15408 | 9/1992 | WIPO . | |

OTHER PUBLICATIONS

IBM Technical disclosure bulletin, "Process for Producing a Precision Filter", vol. 32 No. 4A, Sep. 1989, pp. 126–127.

W. Lang et al., "Application of Porous Silicon as a Sacrificial Layer," *7th International Conference on Solid–State Sensors and Actuators Digest of Technical Papers*, Jun. 7–10, 1993, pp. 202–205.

G. Kittisland et al., "A Sub–micron Particle Filter in Silicon," *Sensors and Actuators*, A21–A23, (1990), pp. 904–907.

*Primary Examiner*—Joseph W. Drodge
*Attorney, Agent, or Firm*—Fish & Richardson P.C.

[57] ABSTRACT

A thin film filter fabricated using surface micromachining. The width of the filter pores is determined by the thickness of a sacrificial thin-film layer. This dimension can be precisely controlled, and may be as small as about 50 angstroms. The pore length may also be determined by the thickness of thin film layers and can therefore be smaller than the limit of resolution obtainable with photolithography. The filters are suitable for use at high temperatures and with many harsh solvents.

10 Claims, 21 Drawing Sheets

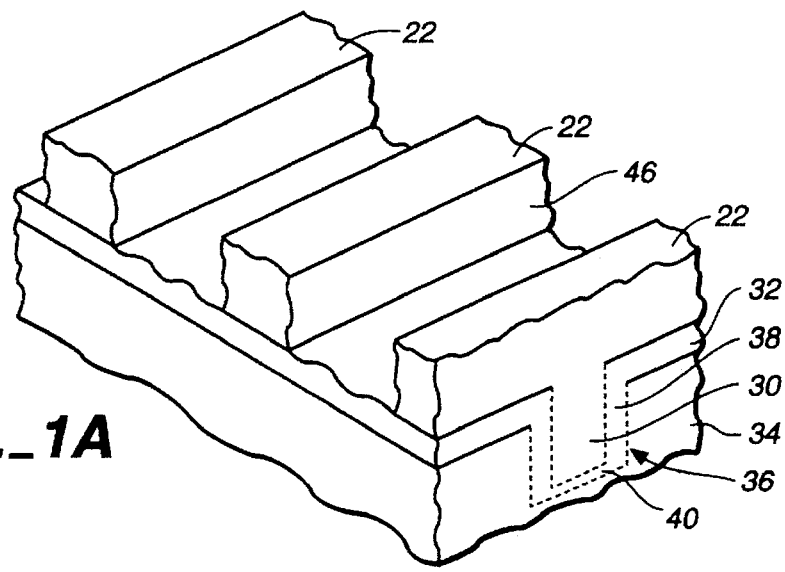
FIG._1A
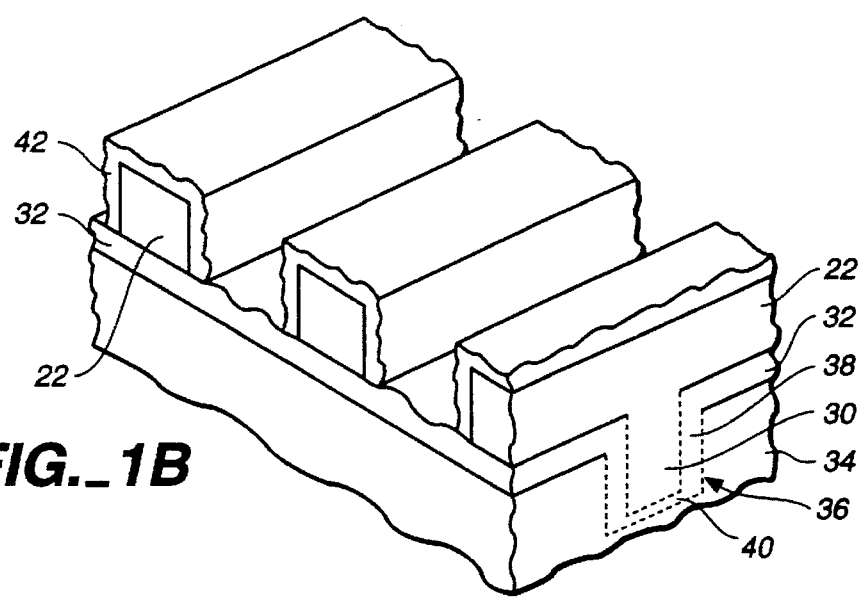
FIG._1B
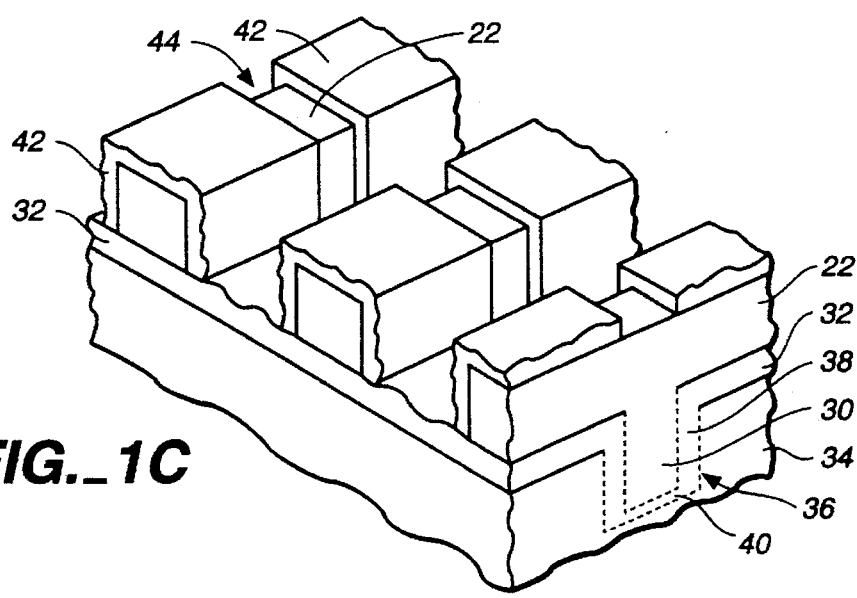
FIG._1C

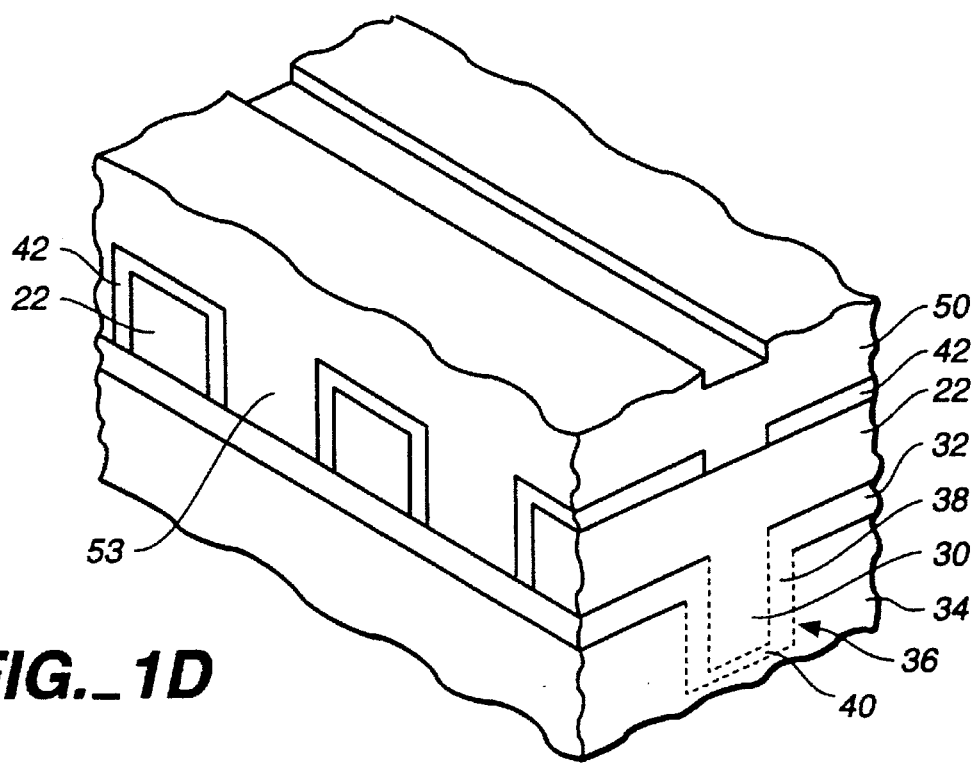
FIG._1D
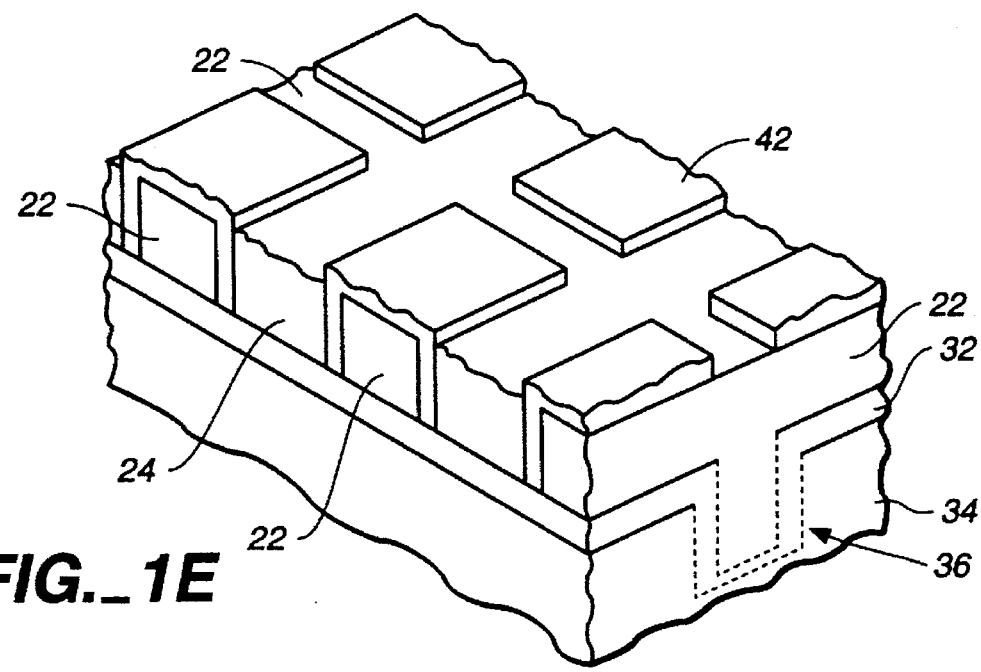
FIG._1E

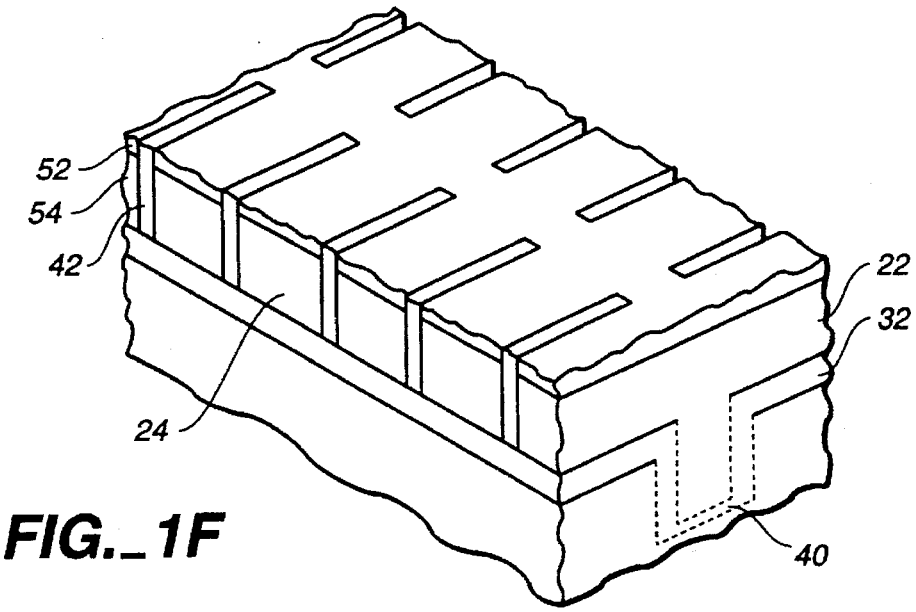
FIG._1F
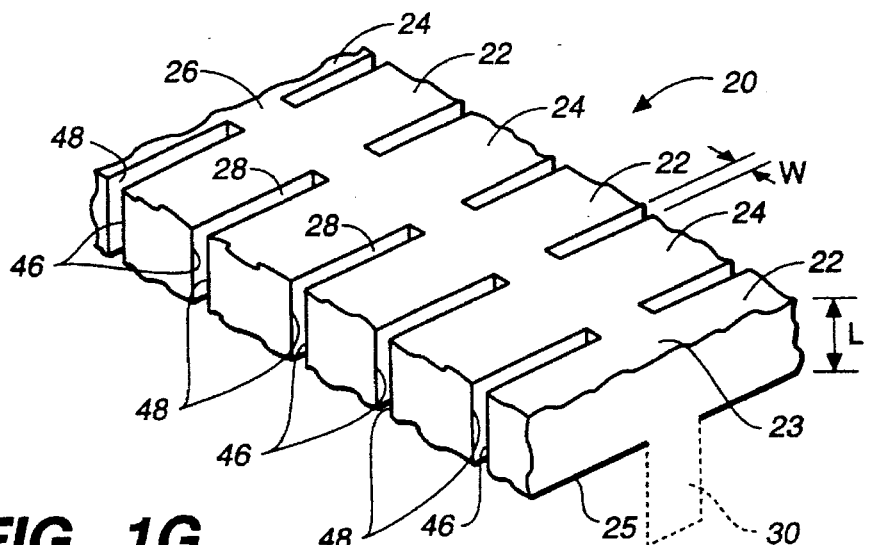
FIG._1G
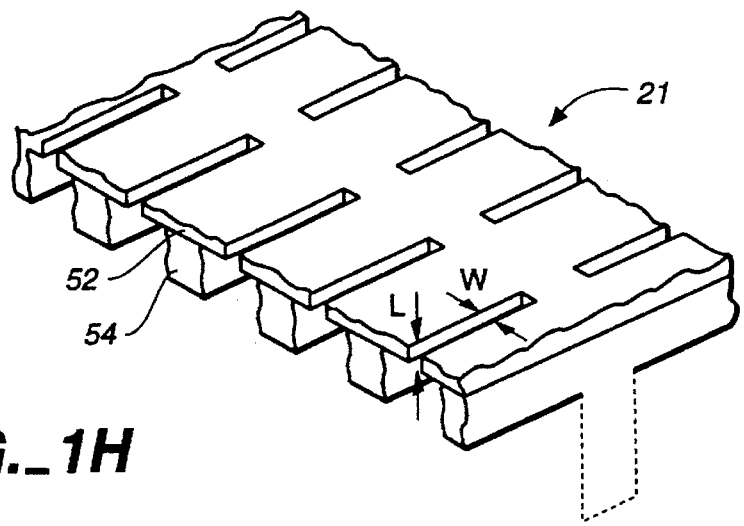
FIG._1H

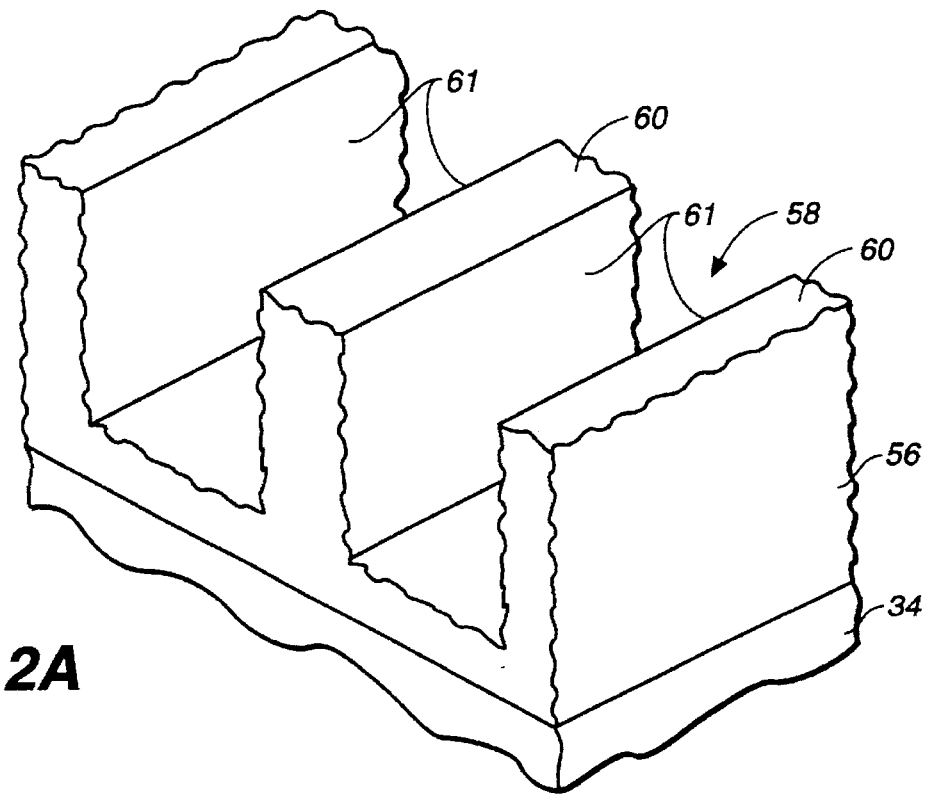
FIG._2A
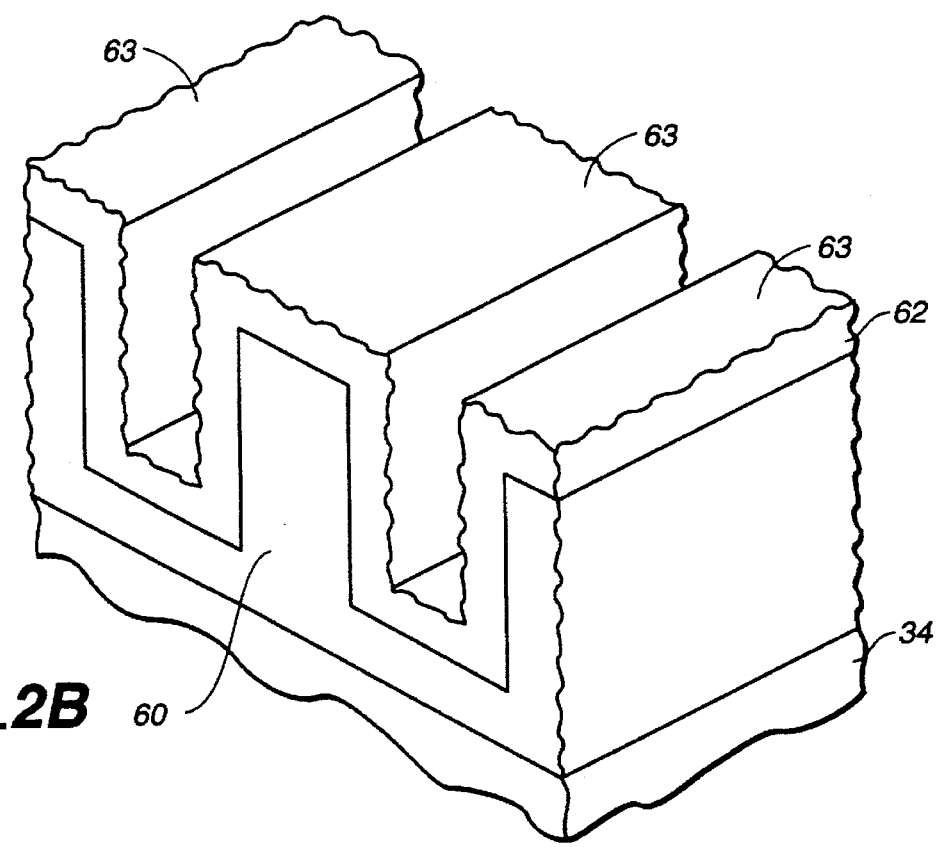
FIG._2B

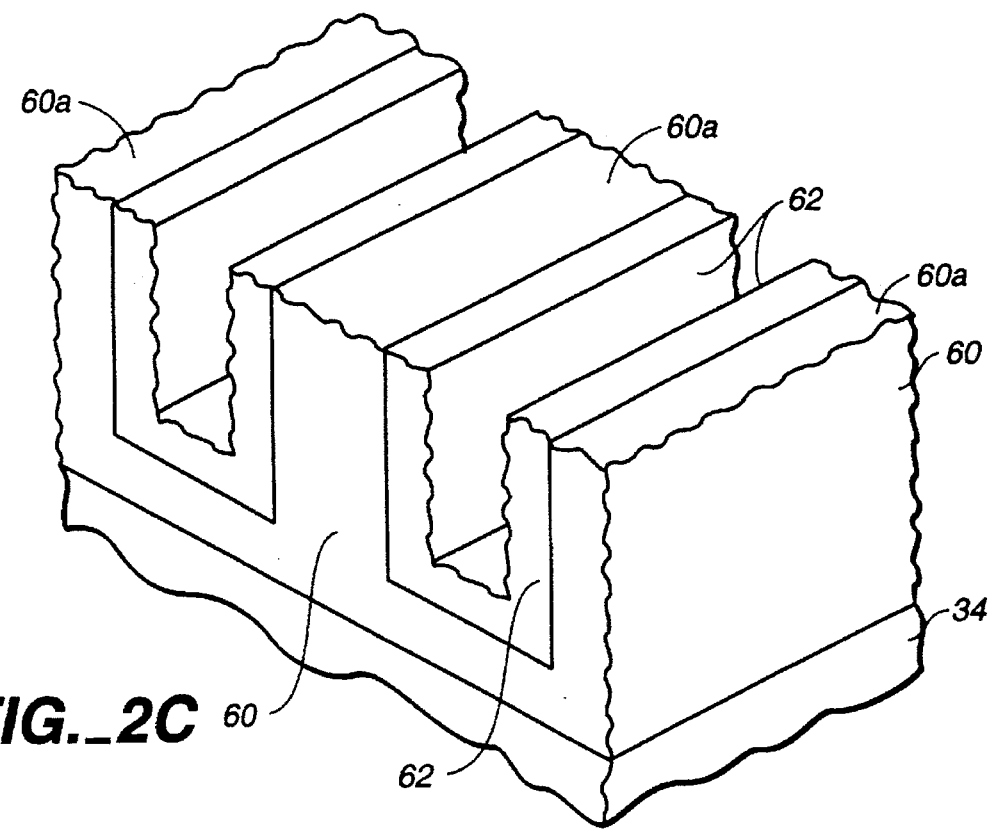
FIG._2C
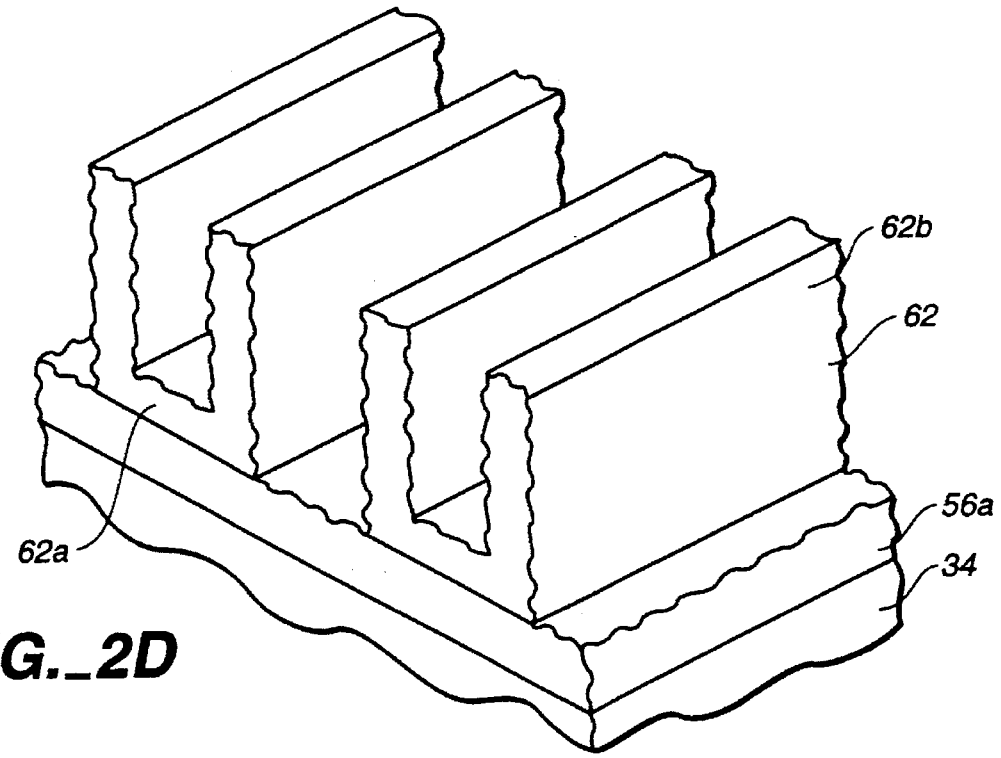
FIG._2D

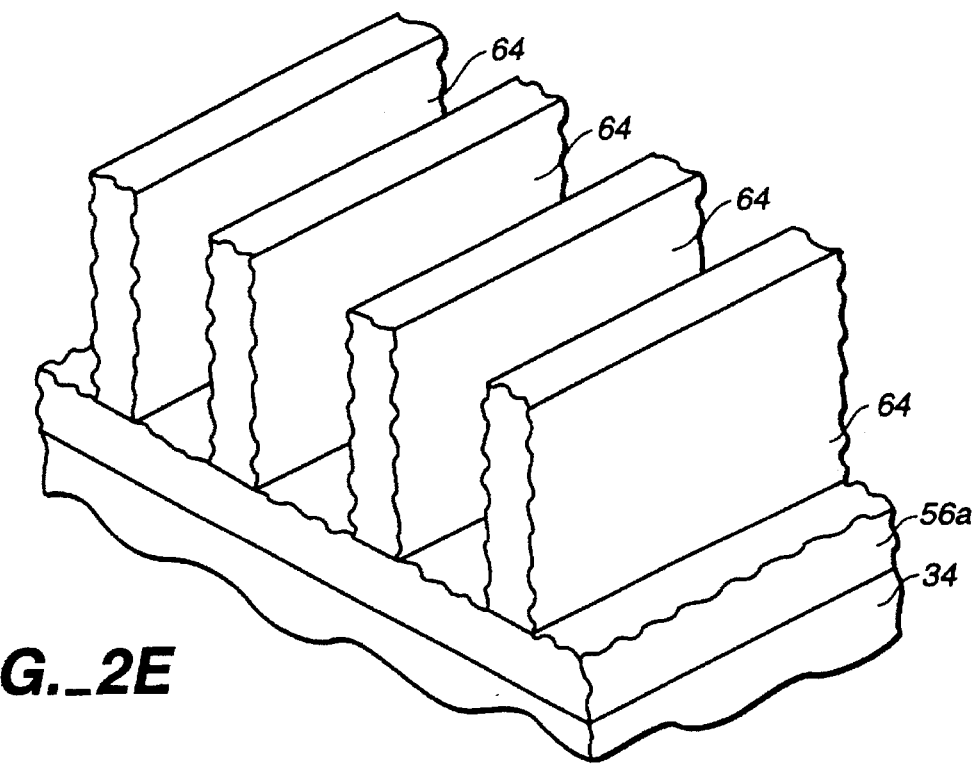
FIG._2E
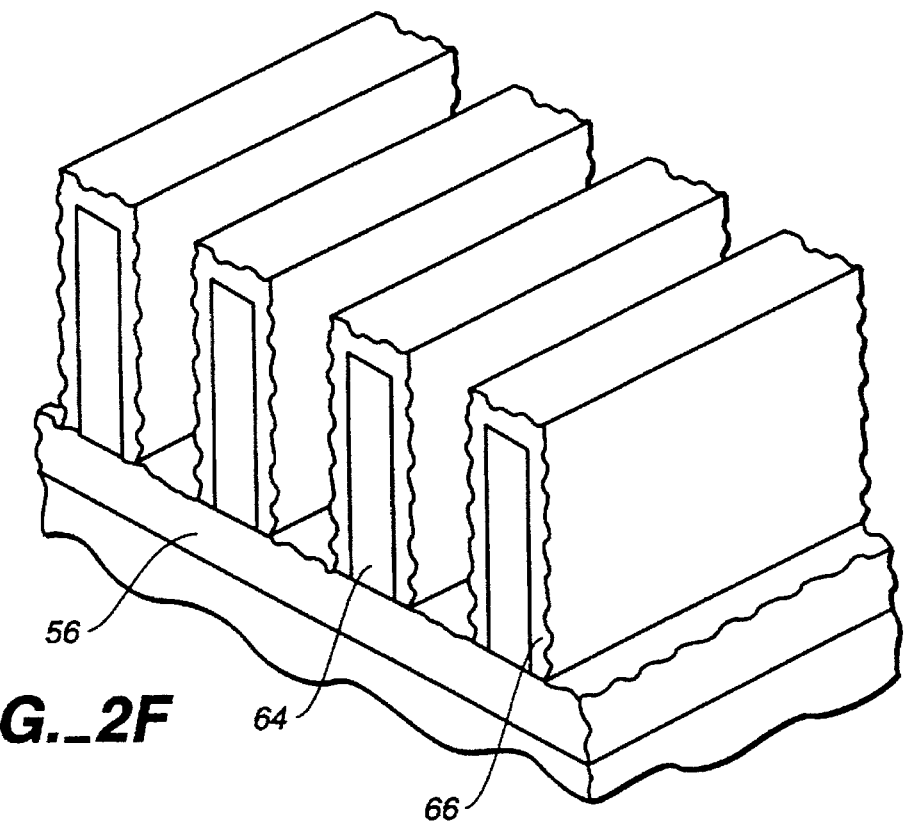
FIG._2F

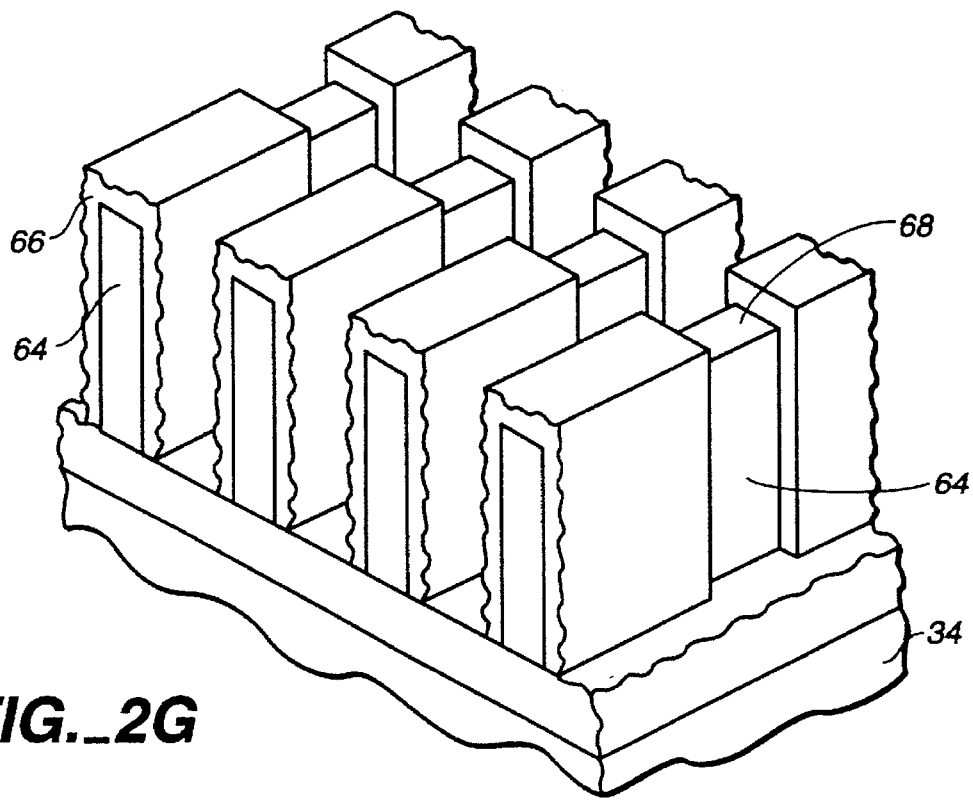
FIG._2G
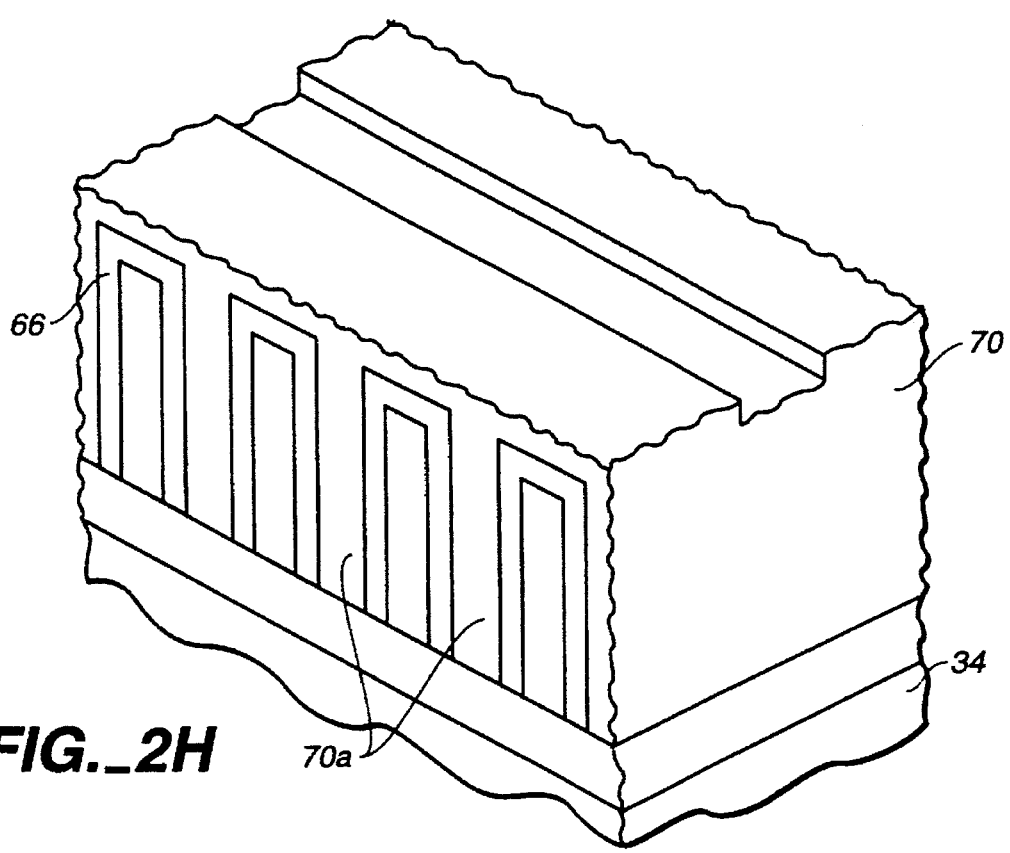
FIG._2H

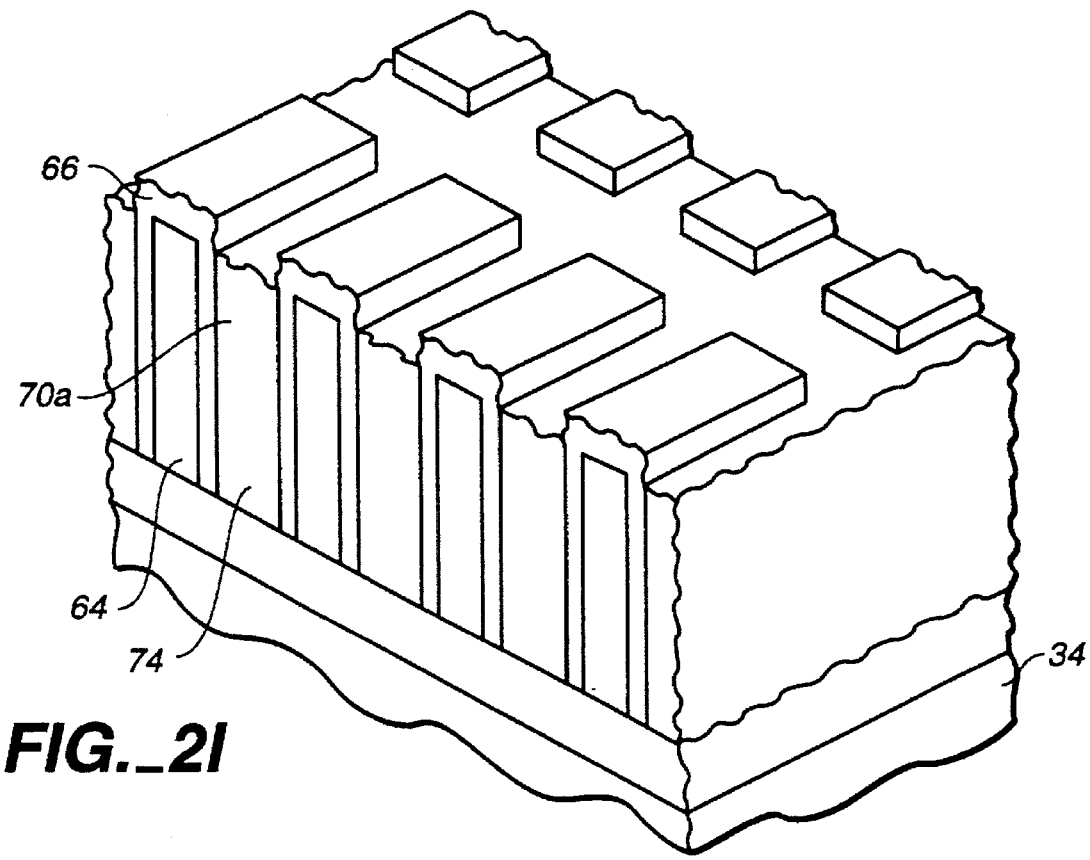
FIG._2I
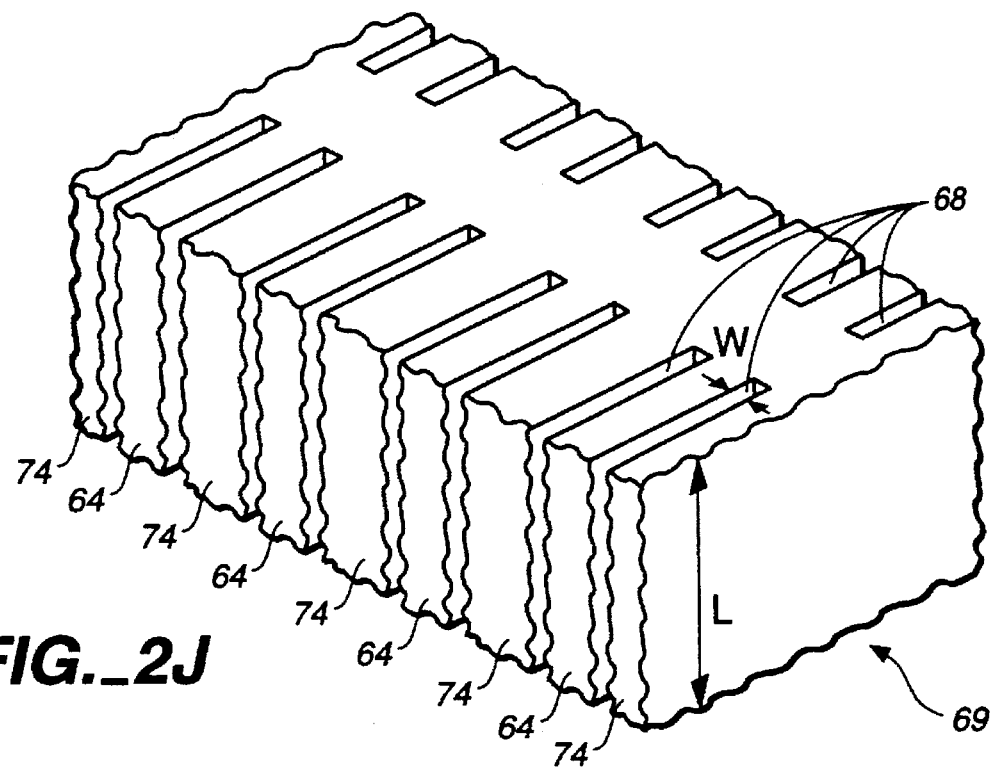
FIG._2J

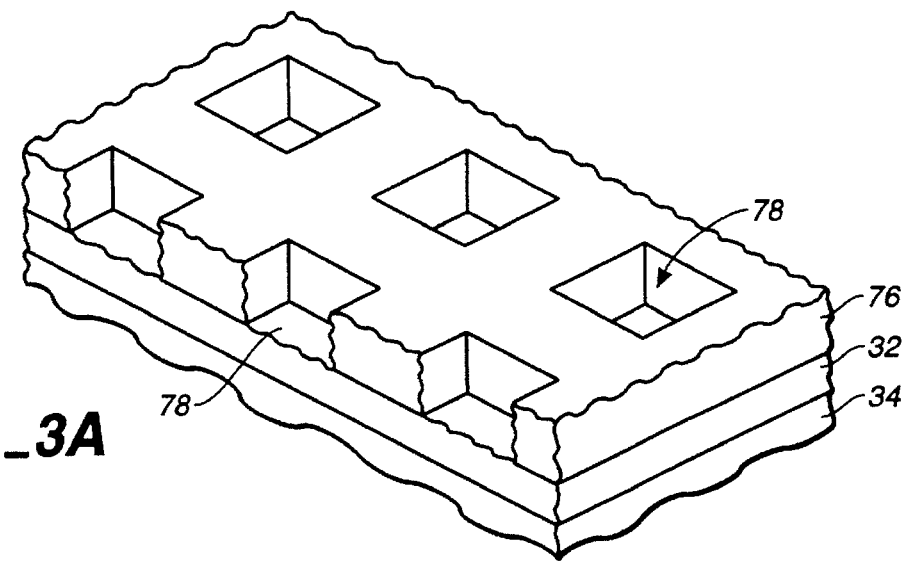
FIG._3A
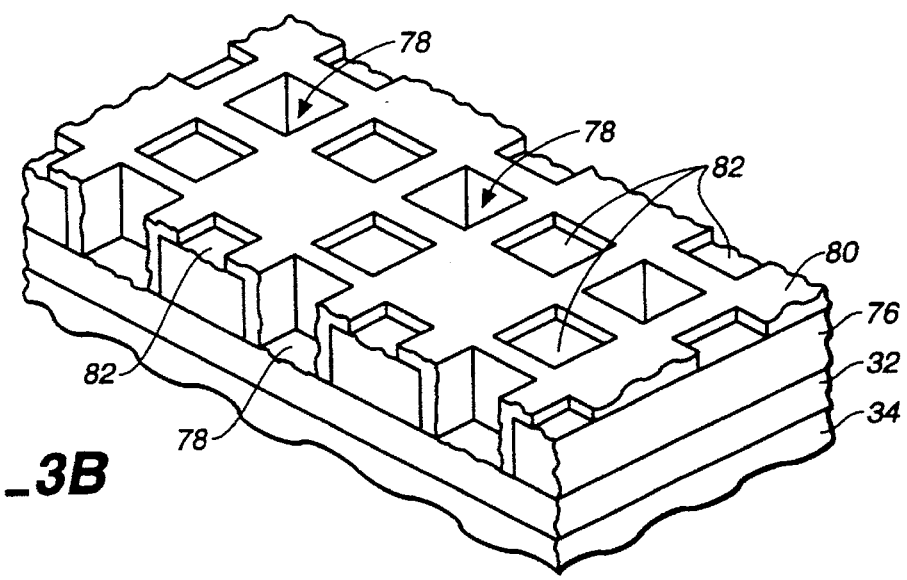
FIG._3B
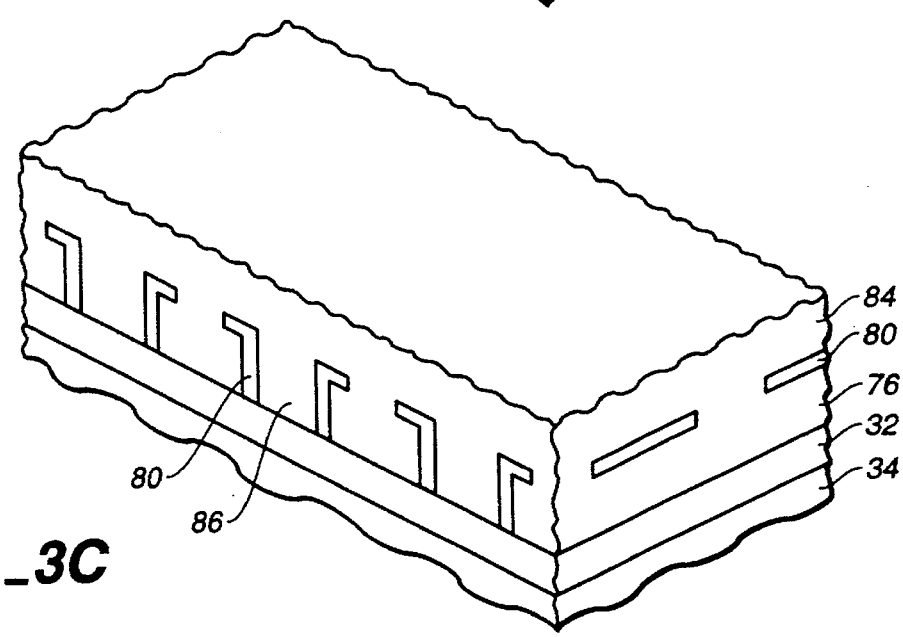
FIG._3C

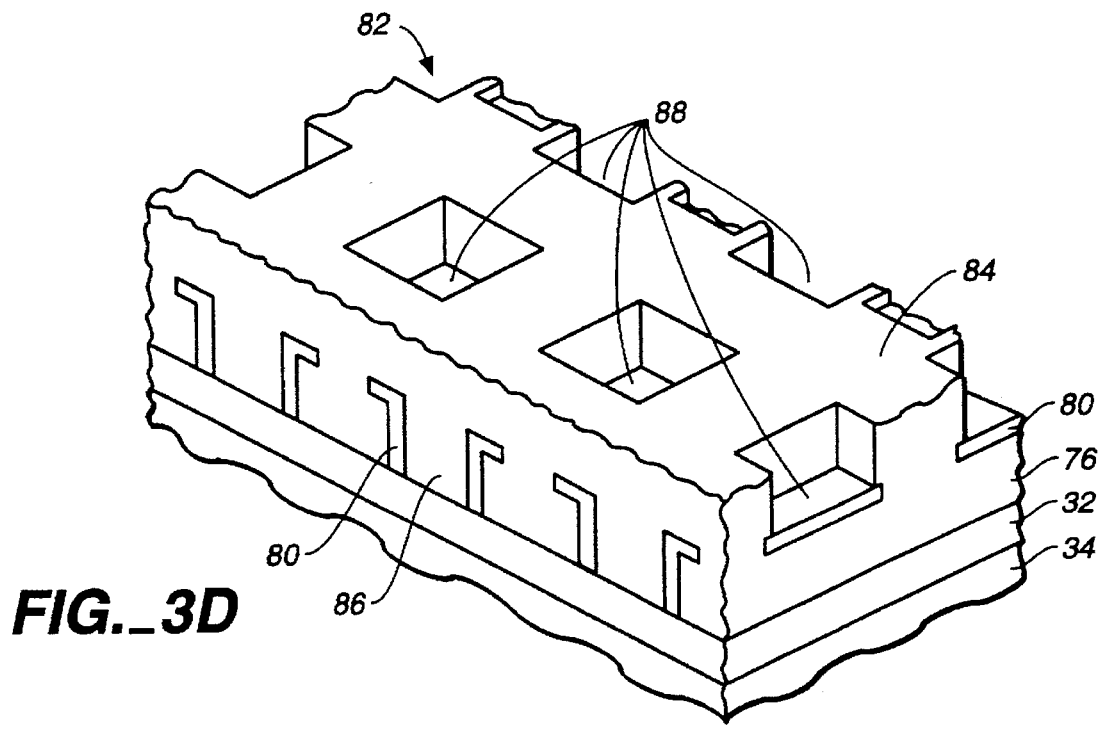
FIG._3D
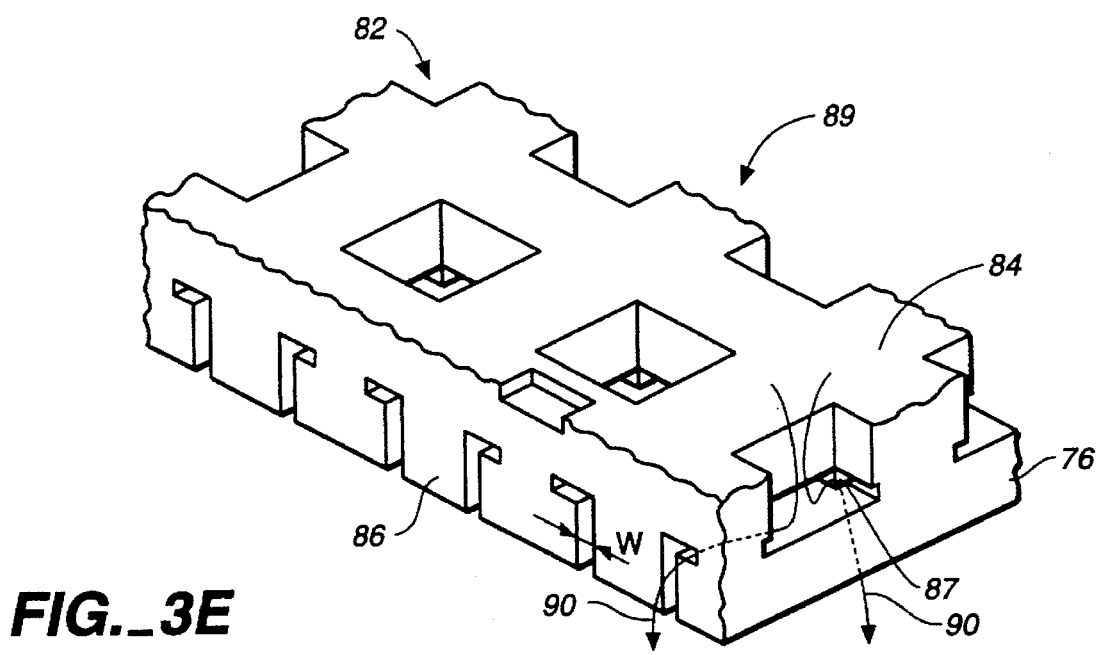
FIG._3E

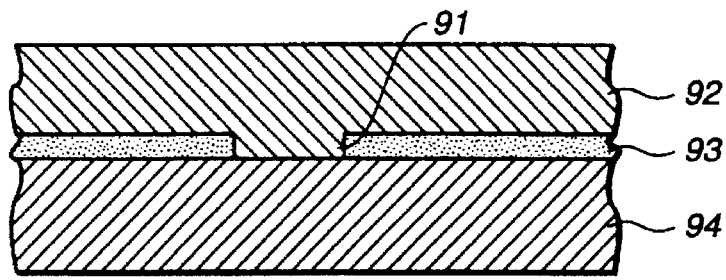
FIG._4A
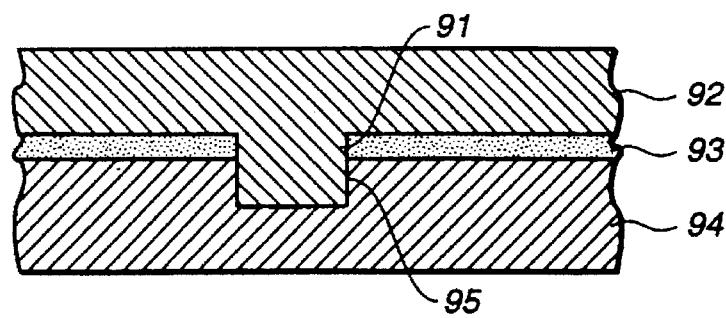
FIG._4B
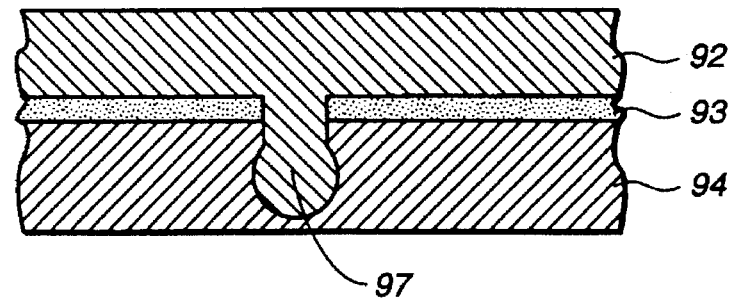
FIG._4C
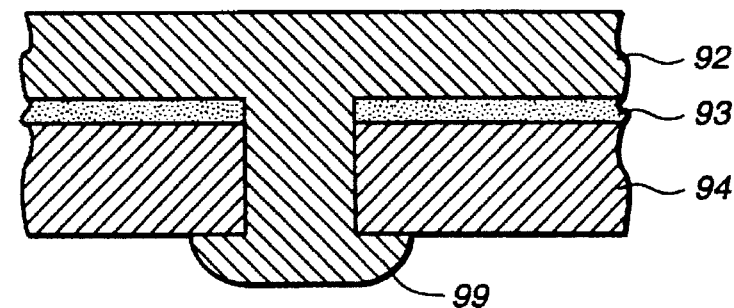
FIG._4D

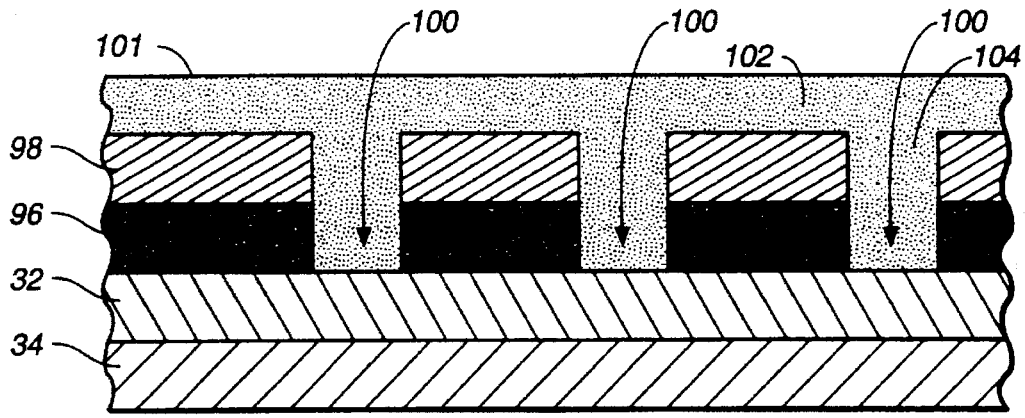
FIG._5A
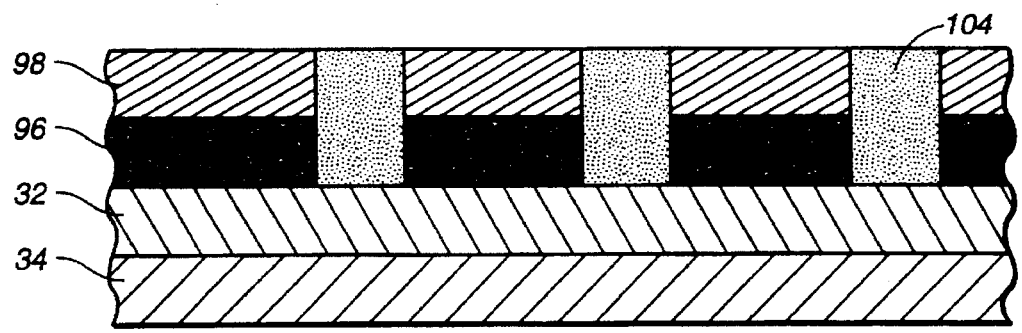
FIG._5B
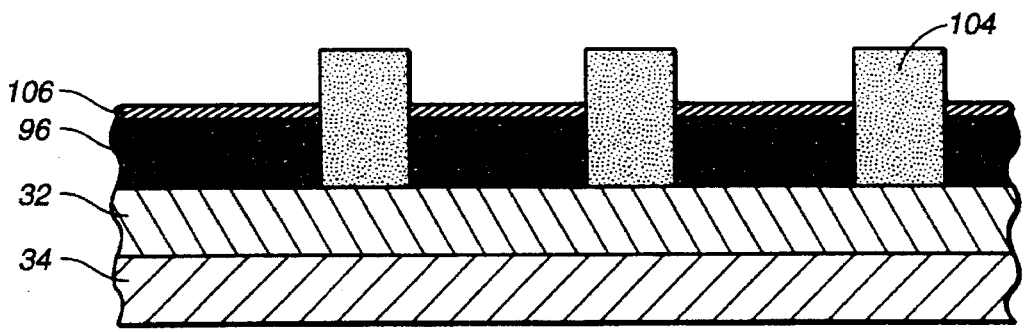
FIG._5C
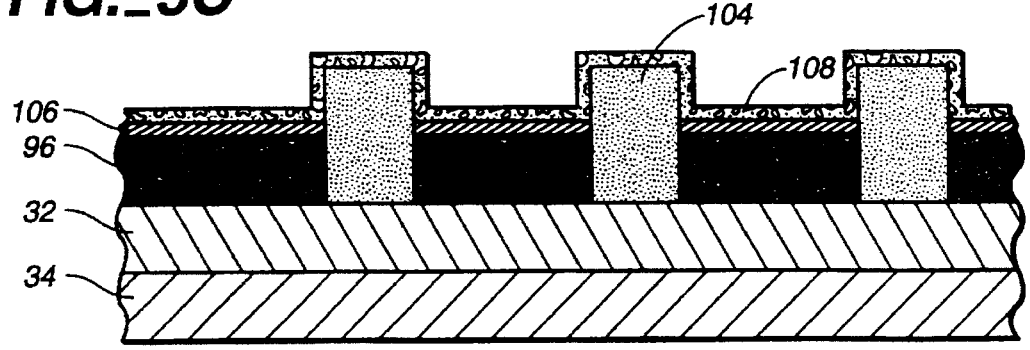
FIG._5D

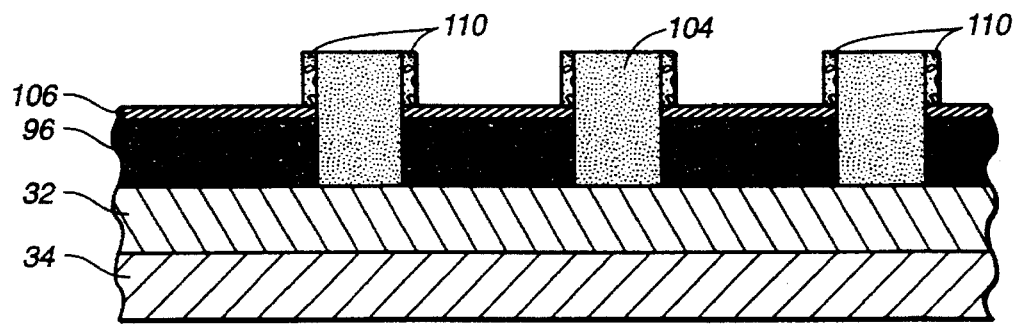
FIG._5E
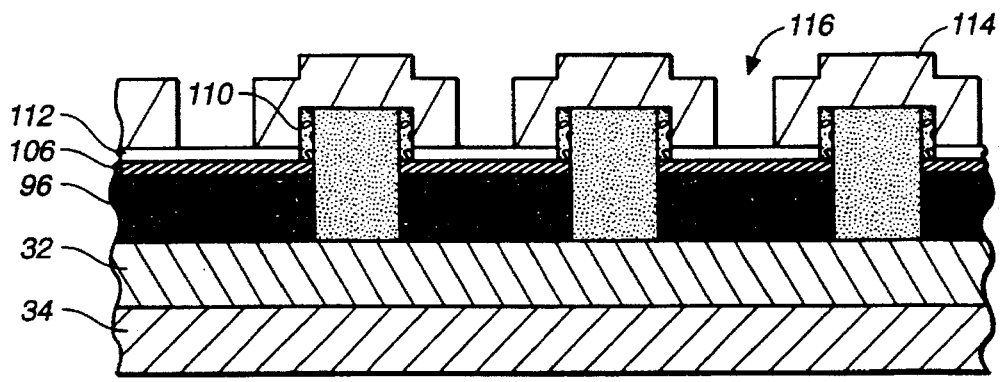
FIG._5F
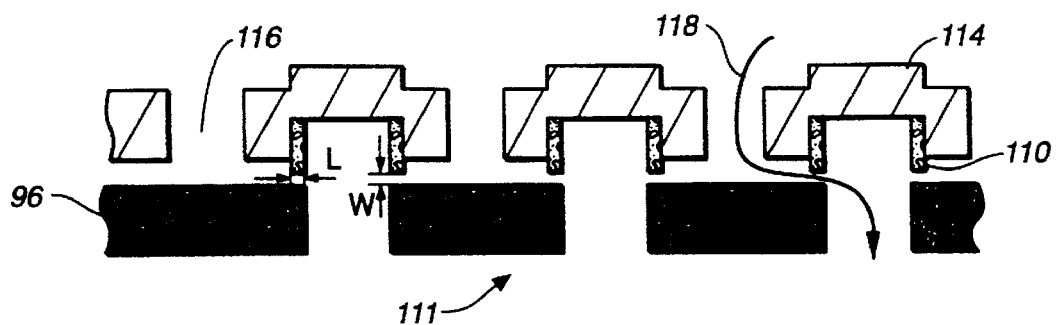
FIG._5G

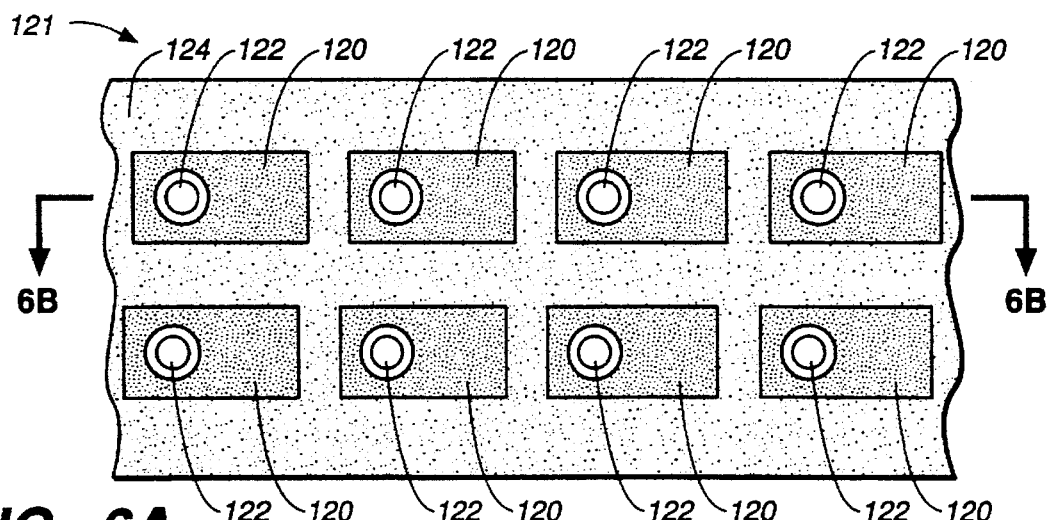
FIG._6A
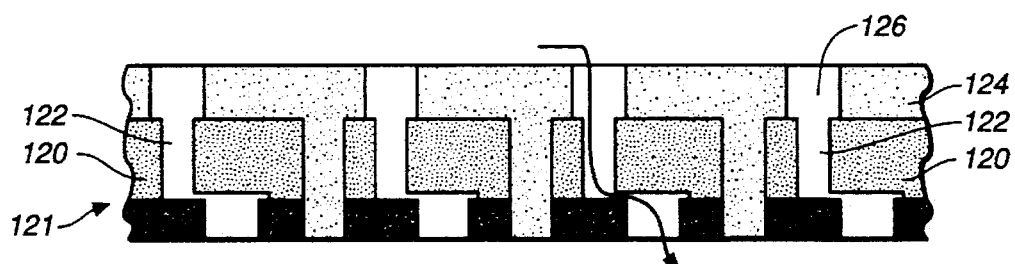
FIG._6B
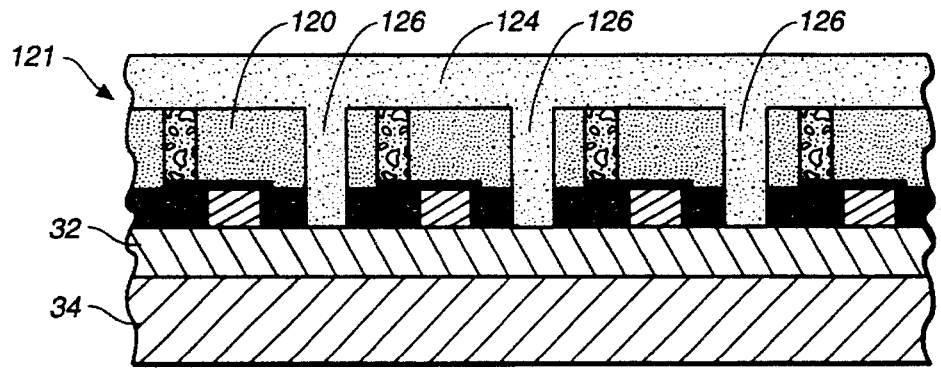
FIG._6C
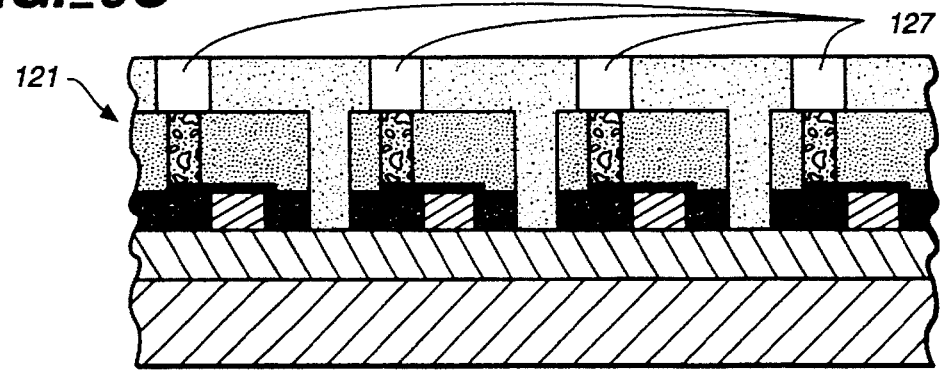
FIG._6D

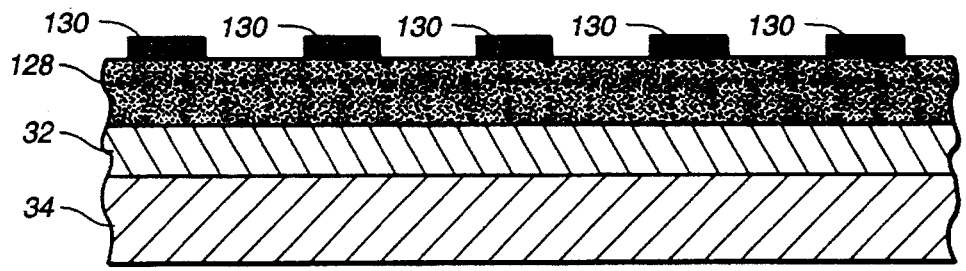
FIG._7A
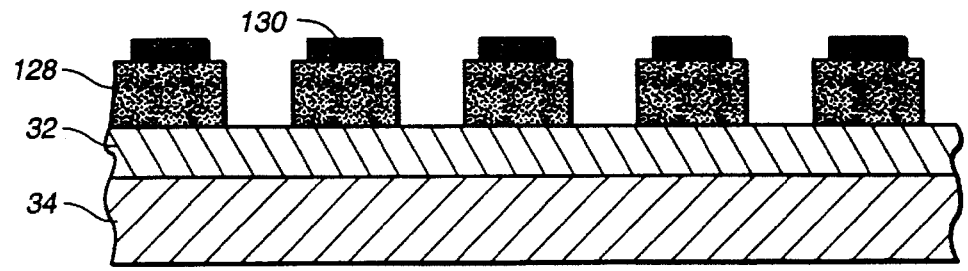
FIG._7B
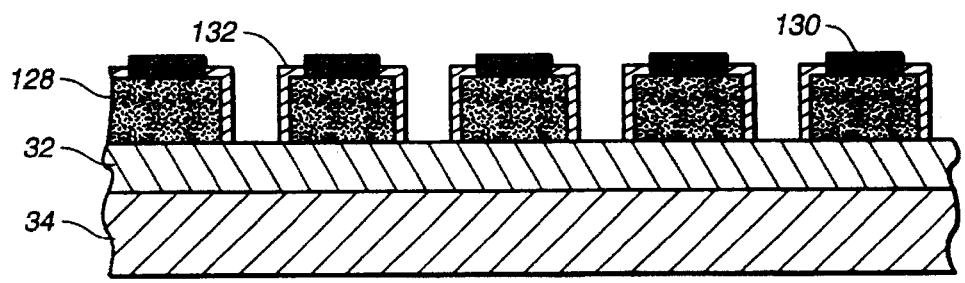
FIG._7C
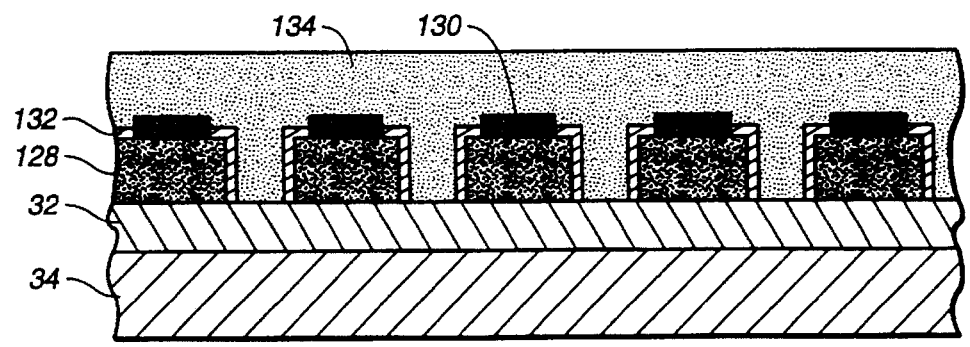
FIG._7D
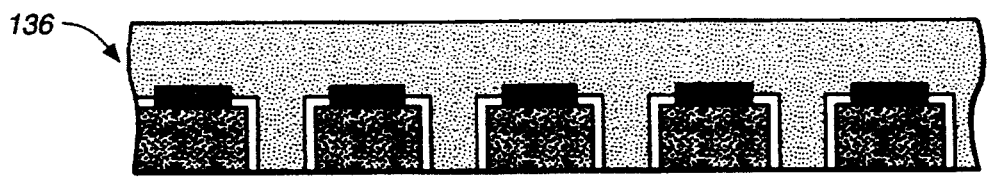
FIG._7E

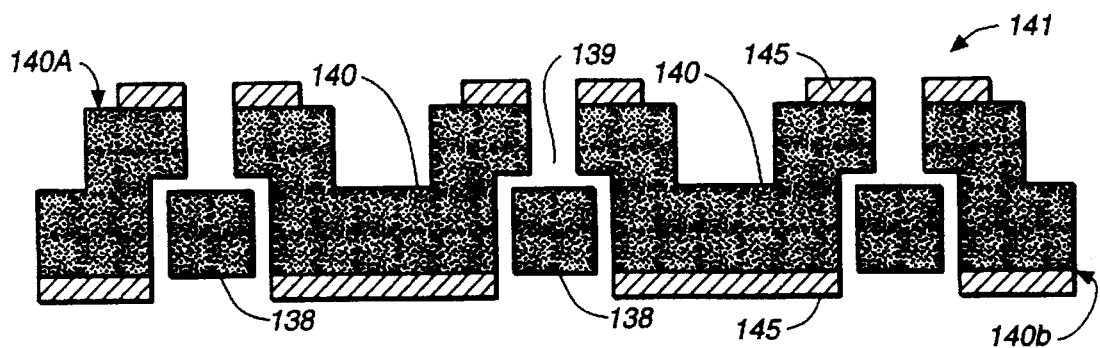
FIG._8A
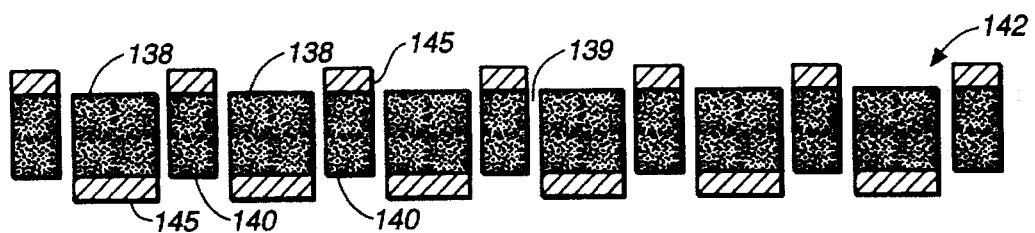
FIG._8B
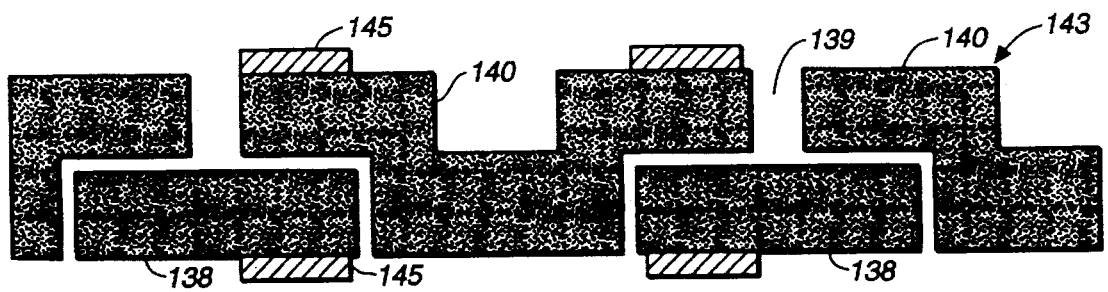
FIG._8C
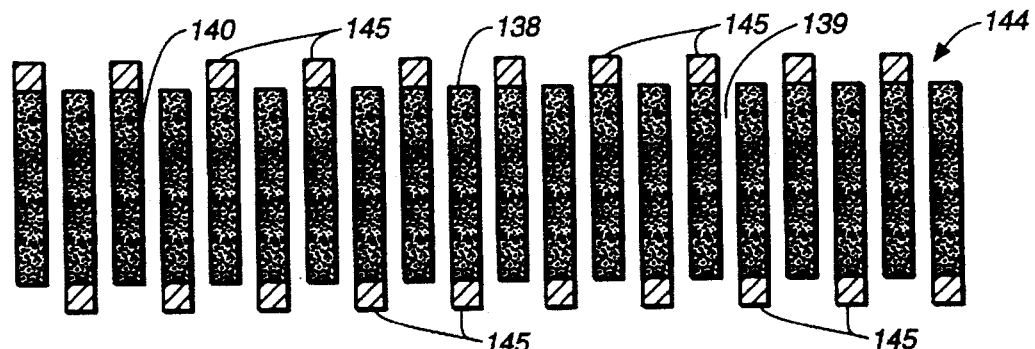
FIG._8D

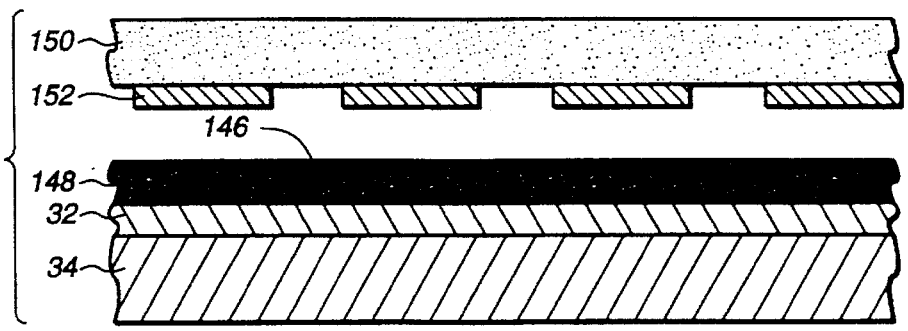
FIG._9A
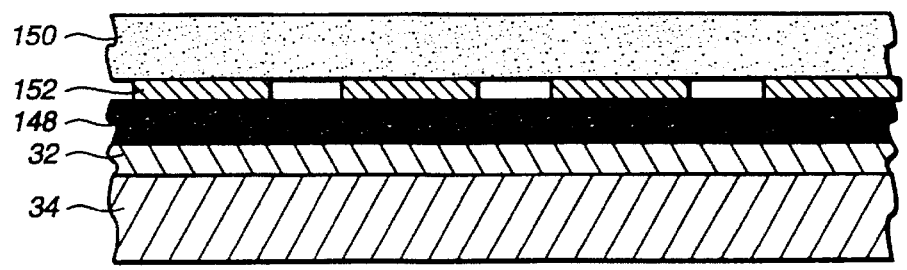
FIG._9B
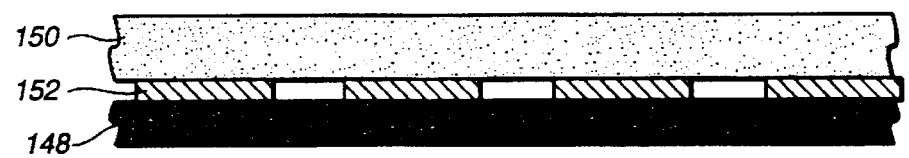
FIG._9C
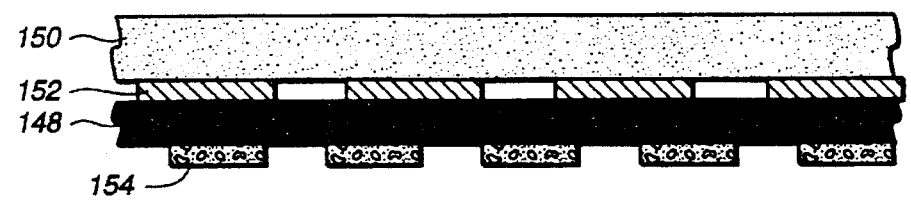
FIG._9D
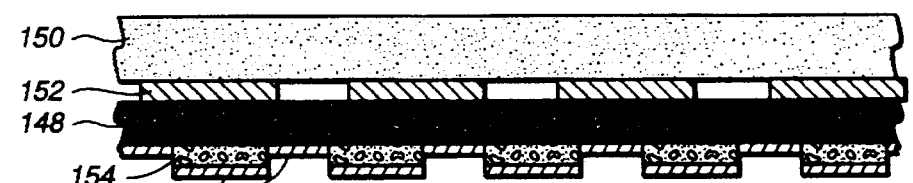
FIG._9E
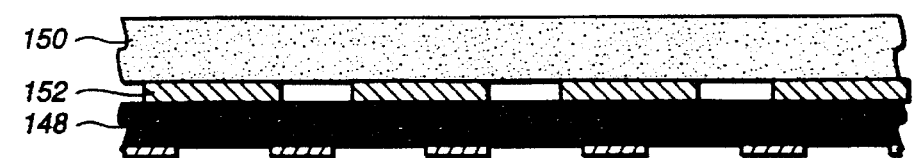
FIG._9F
FIG._9G

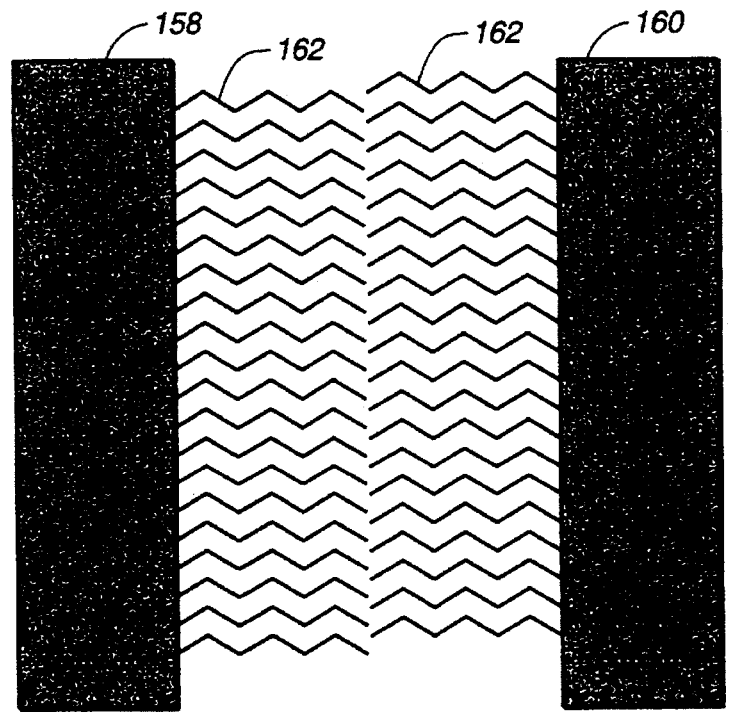
FIG._10A
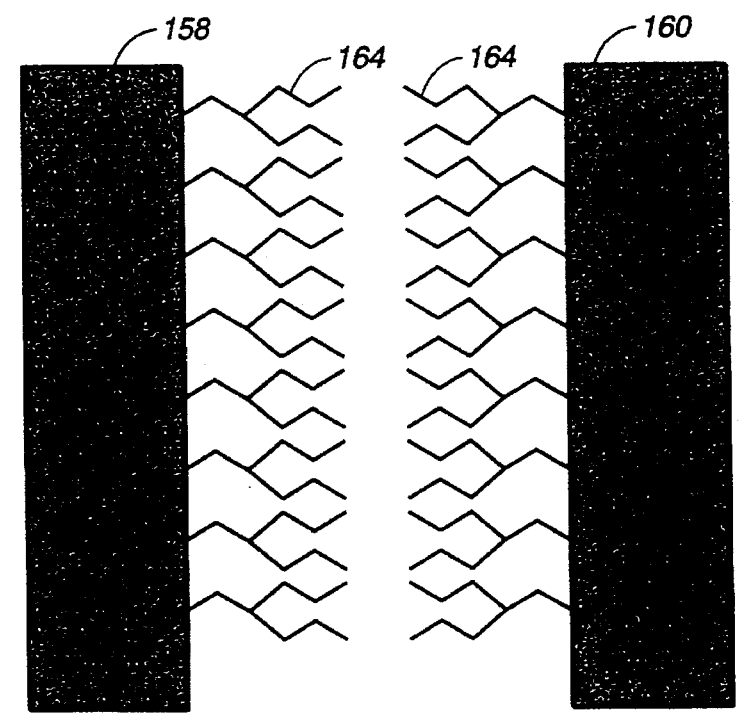
FIG._10B

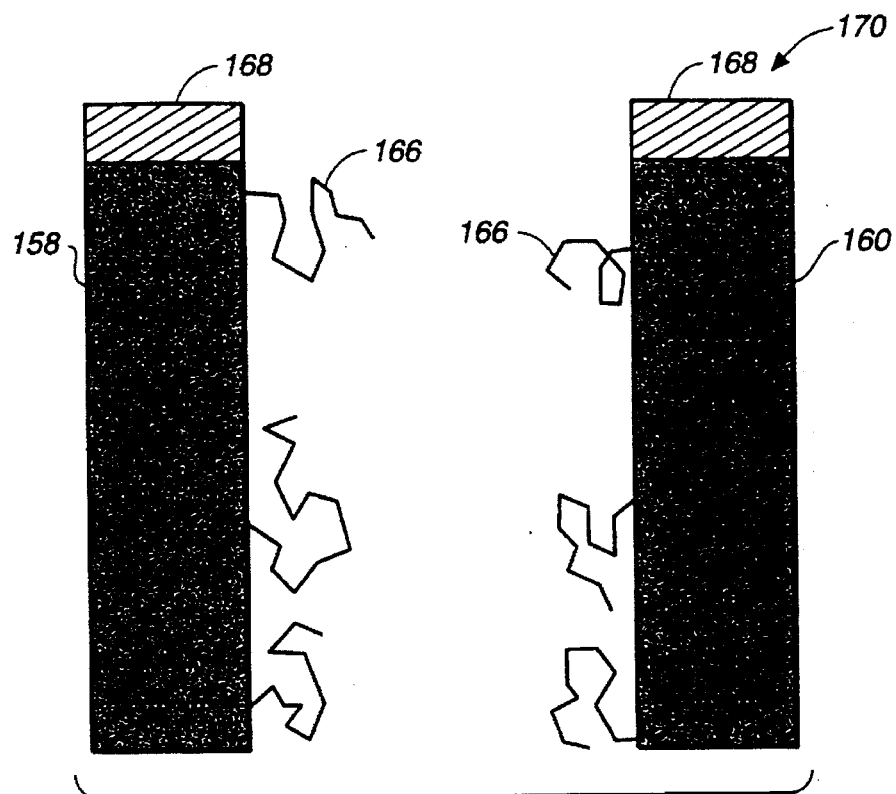
FIG.__11A
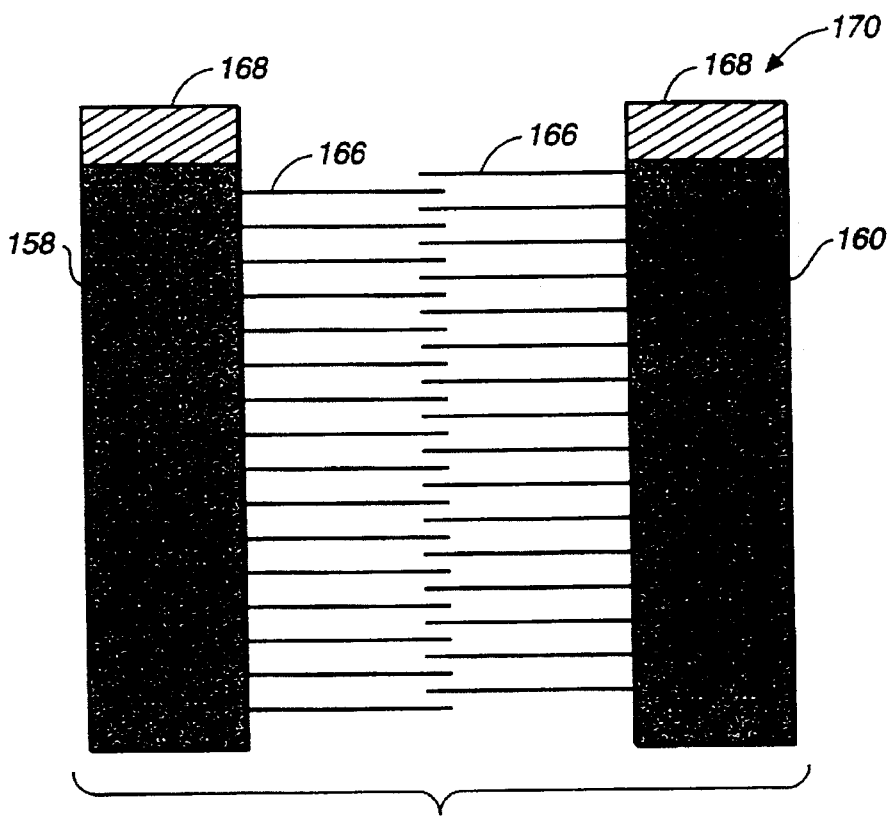
FIG.__11B

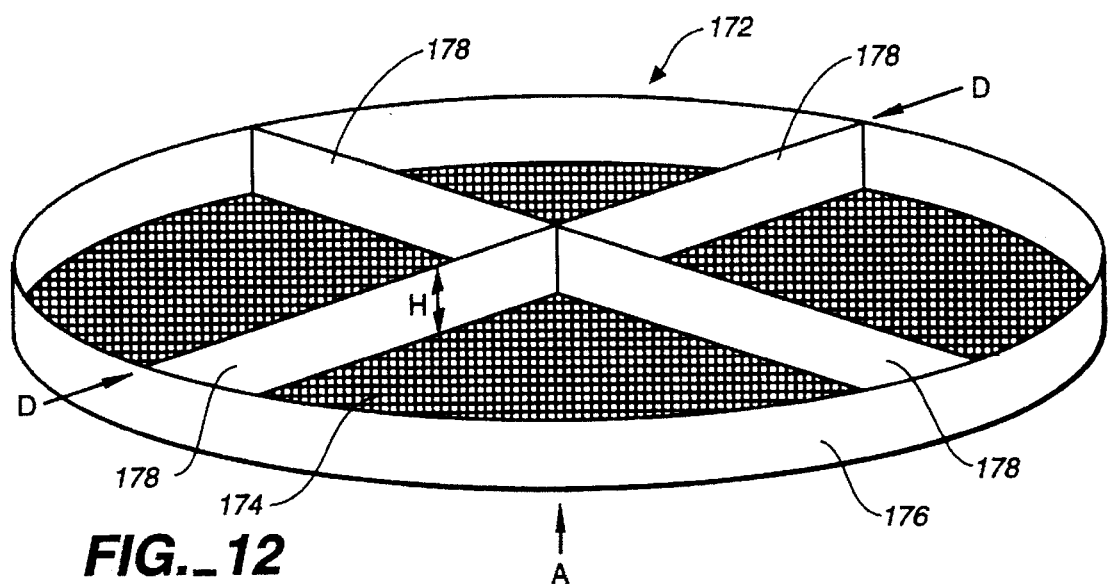
FIG._12
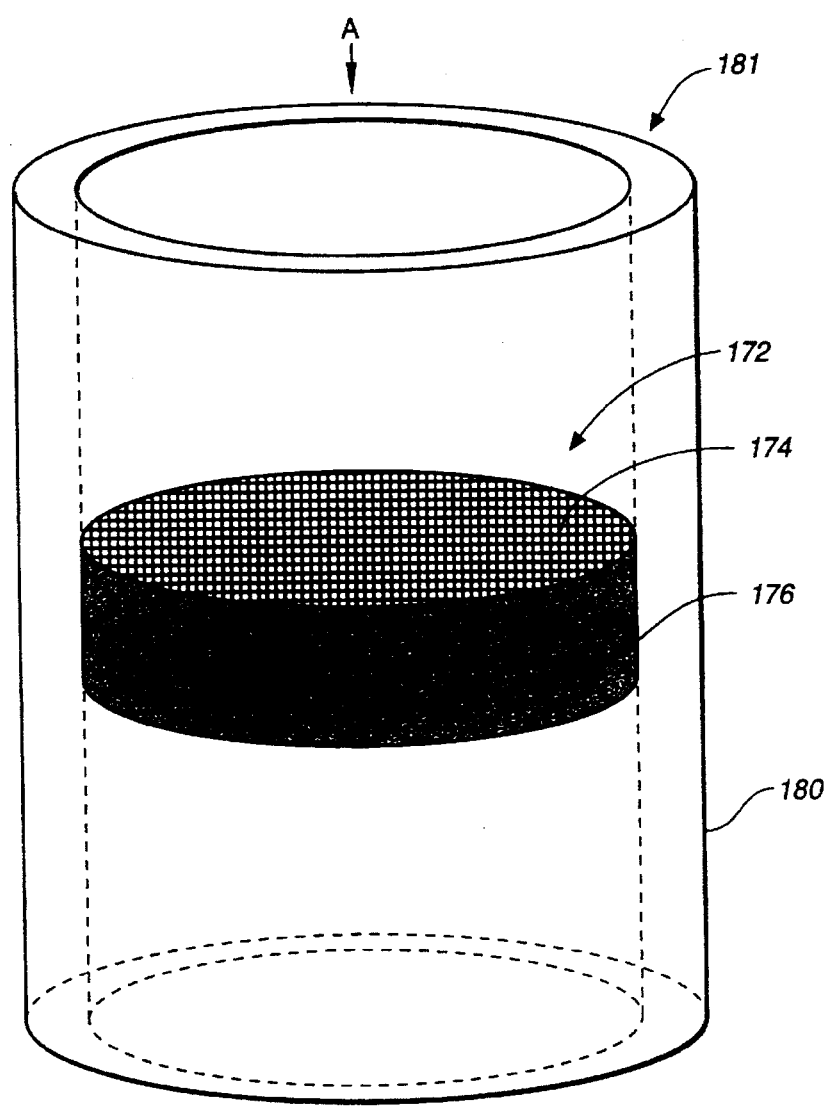
FIG._13

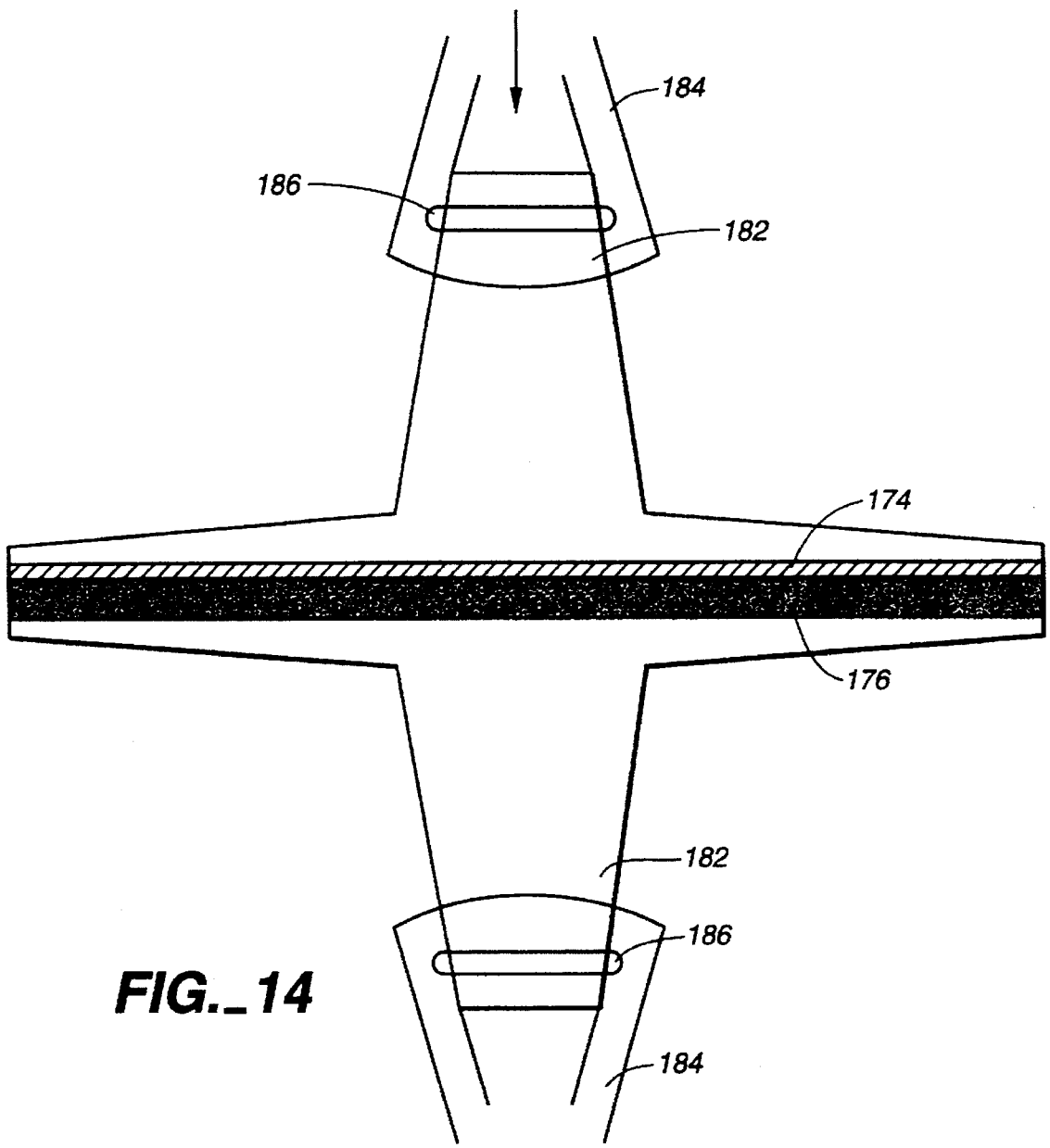
FIG._14

MICROFABRICATED PARTICLE FILTER

BACKGROUND OF THE INVENTION

The present invention relates generally to particle filters, and more particularly to microfabricated thin-film particle filters.

Precise control of filter pore sizes in the 50 to 100 angstrom range, for either organic or inorganic filters, would allow, for example, biologically important molecules to be mechanically separated on the basis of size. In the present state of the art, there is a very limited selection of filters having pores much less than the resolution limit of 0.35 microns of photolithography. The filters known heretofore having pore sizes in this range include polycarbonate membrane filters, sintered filters, zeolites, and one instance of a microfabricated bulk micromachined filter.

Polycarbonate membrane filters (nucleopore filters) may be used where pore sizes between 500 and 3500 angstroms are needed. These filters, however, cannot be used at high temperatures, in strong organic solvents, or where no extracted oligomers can be tolerated. The pores of polycarbonate membrane filters are also randomly located. As such, there is a compromise between having a high enough population of pores per unit area and having too many instances of partially overlapping pores. Partially overlapping pores provide pathways through the filter that allow some particles to get through that are larger in diameter than the rated cut-off size of the filter.

Filters that are available in other materials, such as metals or ceramics, are made by sintering together discrete particles. This technique yields a random structure with a relatively large dead volume and no exact cut-off size above which transport is impossible.

Materials such as zeolites, which have a crystal structure with large channels, can be used as molecular sieves in the limited range of from about 5 to 50 angstroms. Zeolites are not amenable to fabrication as thin membranes.

A microfabricated filter with bulk micromachined structures is described by Kittilsland in *Sensors and Actuators*, A21–A23 (1990) pp. 904–907. This design uses a special property of silicon wherein silicon becomes resistant to a certain etchant when highly doped with boron. The pore length of this filter is determined by the lateral diffusion of boron from a surface source at a single crystal silicon-thermal oxide interface. As is known, such lateral diffusion is the diffusion in the plane of the source, away from the source. The use of this technique makes it very difficult to precisely control the pore length. This filter also does not consist entirely of thin films. i.e. films grown on a substrate by techniques such as cathode sputtering, vacuum evaporation and chemical vapor deposition (CVD). Rather, the fabrication of this filter requires bulk micromachining, including extensive etching of the substrate. As a result, the filter is difficult to integrate with other microfabricated devices. Also the method of fabricating this filter cannot be applied to materials other than silicon.

Thus, it can be seen that currently there are no filters that can be fabricated from a wide variety of materials and that have pores of well controlled shape and size smaller than about 3500 angstroms and arranged in a precise pattern to exclude the possibility of overlap.

Accordingly, an object of the present invention is to provide a thin film inorganic membrane filter having geometrically defined pores of submicron size, with precisely controlled width and length.

Another object of the present invention is to provide thin film diffusion barriers for controlled time release of reagents or medications.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a filter comprising a first thin film structure having openings therethrough, and a second thin film structure positioned relative to the first thin film structure to partially block the openings to produce pores of a predetermined width.

The method of the present invention includes providing a first thin film structure having openings therethrough. A sacrificial layer is formed on at least part of the surface of the first thin film structure. A second thin film structure is formed over the first thin film structure and the sacrificial layer. The sacrificial layer and the second thin film structure block the openings of the first thin film structure, and the second thin film structure leaves a portion of the sacrificial layer exposed. The sacrificial layer is etched to provide the pores of the filter.

Fabrication is done using surface micromachining. The locations of the pores are determined photolithographically, but the width of the pores is determined by the thickness of a sacrificial thin-film layer. The pore width can be precisely controlled, and may be as small as about 50 angstroms. The length and lateral extent (perpendicular to both width and length) of the pores may be determined by photolithography and may range from about 0.3 microns to many microns. In some embodiments, both the pore width and length may be determined by the thickness of the thin film layers, and thus, can be smaller than the limit of resolution obtainable with photolithography.

Inorganic thin film filters are suitable for use at high temperatures, and with many harsh solvents. Applications include absolute particle filters, immunological barrier capsules, and time release diffusion barriers. The molecular crystallization valves and liquid crystal valves described below also allow the filter properties to be changed during use.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIGS. 1A–1F are schematic, perspective, sectional views of intermediate stages in the fabrication of the filters of FIGS. 1G and 1H.

FIGS. 1G and 1H are schematic, perspective, sectional views of two filters according to the present invention.

FIGS. 2A–2I are schematic, perspective, intermediate stages in the fabrication process of the filter of FIG. 2J.

FIG. 2J is a schematic, perspective, sectional view of a filter according to the present invention.

FIGS. 3A–3D are schematic, perspective, sectional views of intermediate stages in the fabrication process of the filter of FIG. 3E.

FIG. 3E is a schematic, perspective, sectional view of a filter according to the present invention.

FIGS. 4A–4D are schematic, sectional views of anchoring a filter structure to another filter structure.

FIGS. 5A–5F are schematic, sectional views of intermediate stages in the fabrication process of the filter of FIG. 5G.

FIG. 5G is a schematic, sectional view of a short diffusion path filter according to the present invention.

FIG. 6A is a schematic, plan view of a filter having discrete pores in a polymer matrix according to the present invention.

FIG. 6B is a schematic, sectional view of the filter of FIG. 6A along lines 6B—6B of FIG. 6A.

FIGS. 6C and 6D are schematic, sectional views of intermediate stages in the fabrication process of the filter of FIG. 6A.

FIGS. 7A–7D are schematic, sectional views of intermediate stages in the fabrication process of the filter of FIG. 7E.

FIG. 7E is a schematic, sectional view of a filter according to the present invention wherein the walls of the pores are electrically insulated from each other.

FIGS. 8A–8D are schematic, sectional views of filters according to the present invention having metal lines for electrical contact to pore walls.

FIGS. 9A–9G are schematic, sectional views of stages in the back side metallization of a filter.

FIGS. 10A and 10B are schematic, sectional views of filter pores having walls coated with covalently bonded functional chemical monolayers.

FIGS. 11A and 11B are schematic, sectional views of filter pores having walls coated with highly polarizable molecules, with and without a voltage applied between the walls.

FIG. 12 is a schematic, perspective, view of a filter according to the present invention.

FIG. 13 is a schematic, perspective view of a filter according to the present invention sealed in a glass tube.

FIG. 14 is a schematic, elevational view of a filter assembly according to the present invention.

DESCRIPTION OF THE PREFERRED EMBODIMENT

The present invention will be described in terms of several preferred embodiments. The preferred embodiments are microfabricated particle filters and methods for their fabrication. A portion 20 of such a filter having top surface 23 and bottom surface 25 and whose pores are slits 28, is shown in FIG. 1G.

The filter of FIG. 1G comprises a plurality of members 22 and 24 interconnected by bridges 26 and forming the walls of a plurality of slits 28. Slits 28 are the pores of the filter. The width of the pores, indicated by arrow W, is the diameter of the largest spherical particle that can pass through the pore. The pore length, indicated by arrow L, is the shortest path through a slit. The filter may optionally include reinforcement ribs such as a rib 30 shown with dotted lines. The filter may be formed of a thin film of amorphous silicon.

As shown in FIG. 1A, fabrication of the filter may begin with a planar substrate 34 such as a silicon wafer. If reinforcement ribs are desired, trenches 36, shown with dotted lines, are etched into the wafer. The trenches may be etched using anisotropic plasma etching of the silicon wafer with a photolithographically patterned silicon dioxide mask that is etched away after the trench etching is complete. It should be noted that the thin film filters of the present invention can be integrated with bulk micromachined components of arbitrary shapes, of which the reinforcement ribs are only an example.

A sacrificial layer 32 is then grown on the substrate 34 to allow the finished filter to be separated from the substrate. If reinforcement ribs are provided, the sacrificial layer must be grown by a method that effectively covers vertical side walls 38 and bottom 40 of trench 36. By way of example, a 2 micron thick film of silicon dioxide may be grown in pyrogenic steam and oxygen at 1100° C. The exposed surface of the substrate is thus coated with a sacrificial layer 32. If the substrate has trenches 36, their bottom and sidewalls, as noted, are also coated by layer 32.

A structural layer (not shown before patterning) is then grown to produce optional ribs 30 and, after patterning, members 22. This layer may be a 2 micron thick film of silicon deposited by chemical vapor deposition (CVD). It is patterned by photolithography and etched to provide members 22, whose sidewalls 46 are one of the two walls of the elongated pores 28 (FIG. 1G).

As shown in FIG. 1B, a thin film 42 is then grown on members 22 to provide a pore sacrificial layer for defining the shape of pores 28. The thickness of this film is equal to the desired width of the pores in the filter. This width may be in the range of 50 to 3000 angstroms, more preferably 50 to 2000 angstroms, and typically 50 to 1000 angstroms. Film 42 may be silicon dioxide grown by oxidizing members 22. It is patterned photolithographically and etched using buffered HF which is isotropic and does not attack photoresist, to expose the underlying structural layer forming members 22 in the areas 44 shown in FIG. 1C, where it is to be bonded to a second structural layer which will provide the walls 48 of pores 28 not provided by members 22.

A second structural layer 50 is then deposited, as illustrated by FIG. 1D. Like the first structural layer of members 22, this second structural layer may be a 2 micron thick film of silicon grown by CVD. Portions 53 of this layer fill the gaps between the sacrificial layer coated members 22. As shown by FIG. 1E, film 50 is then etched back such that only the portions 53 remain to form members 24 of filter 20.

To obtain the filter of FIG. 1G, sacrificial layers 32 and 42 are etched using a process that does not etch the structural layers forming members 22 and 24. For this embodiment, as noted, the sacrificial layers are made of silicon dioxide and may be etched using hydrofluoric acid (HF). If the oxide film connecting the filter to the substrate is deposited rather than grown by oxidizing the substrate, the resulting bare substrate is the same as it was initially, and may be reused to fabricate additional filters. Generally the polysilicon is undoped, but if it is doped for electrical conductivity, then the HF release should be done in a container that excludes light.

The length L of pores 28 (FIG. 1G) may be 2 microns, corresponding to the thickness of the first structural layer used to form members 22. The thickness of this first structural layer must be significantly greater than the thickness of pore sacrificial layer 42 that defines the pore width. For greater fluid throughput through the filter, it is desirable to make the pore length as short as possible.

If the structural layers are made of silicon, a simple modification of the above-described process for fabricating filter 20 allows formation of pores of very short effective length. Such a filter 21 is shown in FIG. 1H. At the point in the process shown in FIG. 1E, pore sacrificial layer 42 may be etched briefly to expose the top surface of members 22 without exposing the sidewalls of the pores. The exposed top region 52 (FIG. 1F) of members 22 and 24 is then doped with boron, either by ion implantation or by thermal diffusion. The remaining portion of pore sacrificial layer 42 is then etched to expose the pore sidewalls, whose lower portion is not doped. A timed wet etch is then performed using an etchant, such as an aqueous solution of potassium hydroxide, that etches silicon that is not boron doped but does not etch boron doped silicon. This etchant reduces the width of the undoped portions 54 (FIGS. 1F, 1H) of members 22 and 24, such that the effective pore length L becomes equal to the thickness of the boron-doped layer 52. As a last step, sacrificial layer 32 bonding the filter to the substrate is etched, resulting in the filter structure shown in FIG. 1H. The preferred width W and length L of the pores (FIG. 1H) are about 50 to 1000 angstroms and 1000 to 5000 angstroms, respectively.

In the process described above, the pitch, i.e. the center-to-center spacing of the pores, is limited by the linewidth achievable by photolithography. The pitch may be halved by forming the first set of members (that were designated 22 in FIG. 1A) as a sidewall structure, as explained below in describing the process shown in FIGS. 2A–2J.

Fabrication begins with a substrate 34, such as a silicon wafer, covered by a sacrificial layer 56 that is photolithographically patterned and partially plasma-etched anisotropically, resulting in ribs 60 and trenches 58. For example, sacrificial layer 56 may be 5 microns of CVD silicon dioxide (low temperature oxide or LTO), and trenches 58 may be etched to a depth of 4 microns. A first structural layer 62 (FIG. 2B) is then grown by a method that gives good coverage of sidewalls 61 of ribs 60. Layer 62 may be low-pressure chemical-vapor deposition (LPCVD) amorphous silicon with a thickness of 2 microns. The top, horizontal portions 63 of structural layer 62 is then removed, for example by lapping it off, resulting in the structure of FIG. 2C, where upper surfaces 60a of ribs 60 are exposed. Ribs 60 are then etched, for example by a wet etch timed to stop at the base of the ribs leaving a continuous sacrificial layer 56a covering substrate 34. In the case of silicon dioxide, hydrofluoric acid may be used.

The resulting structure, shown in FIG. 2D, includes U-shaped portions of structural layer 62, each comprising a horizontal portion 62a and two vertical walls 62b. These are on top of planar sacrificial layer 65 covering substrate 34. First structural layer 62 is then plasma etched anisotropically to remove its lower horizontal portion 62a while retaining vertical walls 62b to form a set of parallel members 64 as shown in FIG. 2E. This etch is done using a chlorine/helium plasma. The structure of members 64 is similar to members 22 of FIG. 1A, but members 64 provide a denser pitch.

The process carried out next is similar to that described with respect to FIGS. 1B–1E. More specifically, as shown in FIG. 2F, a thin film 66 is grown on members 64 to provide a pore sacrificial layer for defining the shape of the pores. As discussed, the thickness of this film is equal to the desired pore width, typically 50 to 3000 angstroms. Film 66 may be silicon dioxide grown by oxidizing members 64. Film 66 is then patterned photolithographically and etched to expose the underlying structural layer 62 in the areas 68 as shown in FIG. 2G. This is where structural layer 64 is to be bonded to a second structural layer 70 (FIG. 2H), which provides the pore walls not provided by members 64. Like the first structural layer 64, the second structural layer 70 may be a 2 micron thick film of silicon grown by CVD. Portions 70a of this layer fill the gaps between the sacrificial layer coated members 64. As shown in FIG. 2I, film 70 is then etched back by chlorine/helium plasma such that only the portions 70a remain to form members 74 of filter 69 of FIG. 2J.

To obtain the filter of FIG. 2J, the sacrificial layers may be etched using a process that does not etch the structural layers as discussed above. For this example, the sacrificial layers are made of silicon dioxide and may be etched using hydrofluoric acid. The width W and length L of the resulting pores of filter 69 may be about 50–1000 angstroms and about 24 microns, respectively.

In the above embodiments, filters 20, 21 and 69, the second structural layers 50 and 70 are etched back and the resulting pores are straight through pores. Pores whose ends are not in line of sight of each other may be obtained by etching apertures in the second structural layer above unetched portions of the first structural layer (i.e. members 22 or 68). It should be noted that this is possible only if the unetched portions of the first structural layer are large enough to cover a photolithographically defined aperture. The fabrication of such a filter is described with reference to FIGS. 3A–3E.

Again fabrication may start with a substrate 34, such as a planar silicon wafer, coated with a sacrificial layer 32 of silicon dioxide (FIG. 3A). A first structural layer 76 can then be deposited over sacrificial layer 32 and patterned by photolithography and etching to form apertures 78. Layer 76 may be a 2 micron thick amorphous silicon film grown by CVD.

As shown in FIG. 3B, a thin film 80 is then grown on film 76 to provide a pore sacrificial layer for defining the pore shapes. The thickness of this film is equal to the desired width W of the pores in the filter, typically 50 to 3000 angstroms. Film 80 may be silicon dioxide grown by oxidizing film 76. It is patterned photolithographically and etched to expose the underlying structural layer 76 in the areas 82. This is where first structural layer 76 will be bonded to a second structural layer 84 which will provide the walls of the pores that are not provided by film 76.

Second structural layer 84 is then deposited, as shown in FIG. 3C. Like the first structural layer, the second structural layer may be a 2 micron thick film of silicon grown by CVD. Portions 86 of this layer fill the apertures 78 of film 76. Film 84 is then photolithographically patterned and etched to form apertures 88 that fit completely above unetched portions of first structural layer 76, resulting in the structure of FIG. 3D.

To obtain the filter 89 of FIG. 3E, the sacrificial layers 32 and 80 may be etched using a process that does not etch the structural layers 76 and 84, as discussed above. For this embodiment, the sacrificial layers are again made of silicon dioxide and may be etched using hydrofluoric acid. Arrows 90 in FIG. 3E show the bent paths that must be traveled to pass through the pores 87 of the resulting filter. The width of the pores, indicated by arrow W, may be about 50 angstroms or larger. The length of the pores may be as low as one micron if apertures 78 and 88 are close to each other and the first structural layer is sufficiently thin. For chemical time release and chromatography, the length of the pores may be made as high as 10000 microns by spacing apertures 78 and 88 sufficiently far apart.

In the embodiment of FIG. 3E, the second structural layer 84 was anchored to the first structural layer 76 by providing pore sacrificial layer anchoring holes 82 (FIG. 3B). This exposes the top surface of first structural layer 76 before deposition of second structural layer 84, as shown in FIG. 3C. This type of bonding is also shown schematically in FIG. 4A, where a first structural layer 94 and a second structural layer 92 may be chemically bonded through an aperture 91 in a pore sacrificial layer 93, as was done in the fabrication of filters 20 (FIG. 1G), 21 (FIG. 1H), 69 (FIG. 2J), and 89 (FIG. 3E). It should be noted that no oxide be present on the first structural layer at the anchoring surface. Many variations of this anchoring scheme are possible without departing from the scope of the present invention. Such alternative schemes, described below, may be used to optimize the bonding of different materials used as the structural layers.

As shown schematically in FIG. 4B, after opening anchoring holes 91 in pore sacrificial layer 93, first structural layer 94 may be partially etched as represented by surface depression 95, to increase the bonding area. In this example, the first structural layer is etched anisotropically. If first structural layer 94 is etched isotropically as shown schematically in FIG. 4C to provide undercut recess 97, mechanical locking of layer 92 in recess 97 of layer 94 is also provided. It is also possible to etch completely through the first structural layer, as shown in FIG. 4D, and then do a timed isotropic etch of the underlying sacrificial layer to provide an empty space underneath the first structural layer. Second structural layer 92 will then fill this space to form a rivet-like shape 99.

For applications in which high flux transport is needed, the pore length should be as short as possible, for example between about 500 and 5000 angstroms. Filter 21 of FIG. 1H is a filter having such short pore lengths L. Another short pore length filter 111 may be fabricated using the process illustrated in FIGS. 5A–5F, which represent cross-sections through the pores.

As shown in FIG. 5A, this fabrication process may start with a substrate 34 such as a silicon wafer. The wafer may be cleaned by immersion for 10 minutes in 1:5 aqueous hydrogen peroxide/sulfuric acid at 120° C., followed by a rinse in deionized (DI) water. Next, the wafer may be immersed in HF 10 to 20% for 10 minutes, and rinsed in DI water until the resistivity of the rinse water is greater than 11 megaohm-cm.

A sacrificial layer 32 is grown on the substrate. Layer 32 may be phosphosilicate glass (PSG) formed by CVD in a tube furnace at 450° C., pressure of 300 mT, and flow rates of 90 sccm oxygen, 60 sccm dichlorosilane, 10 sccm phosphine, and nitrogen as diluent. The deposition rate depends on the system and may be 100 angstroms per minute. The thickness of the PSG may be 1 microns, but more may be used if deep stiffening ribs are used in the filter. The PSG may be densified in nitrogen at 1050° C. for one hour.

A first structural layer 96 is then grown over the sacrificial layer. This structural layer may be two microns of amorphous silicon, as discussed above. The deposition may be done in an LPCVD furnace at 580° C., 300 millitorr (mT) pressure, with 100 sccm silane. The deposition rate may be 1 micron in 3 hours. Enough polysilicon should be applied to completely fill the trenches that form the stiffening ribs. The resulting surface may not be smooth if trenches for stiffening ribs are present. It is recommended that the surface be lapped flat and polished to leave a surface layer of polysilicon that is 2 microns thick.

Next, a sidewall clearance sacrificial layer 98, such as 1 micron of CVD deposited silicon dioxide (LTO), is grown. The LTO may be deposited at 450° C., oxygen 90 sccm, dichlorosilane 60 sccm, 300 mT.

Filter exit holes 100 are etched through sidewall clearance sacrificial layer 98 using an anisotropic $HCF_3$ and $CF_4$ plasma etch for oxide, and first structural layer 96 using an anisotropic etch for polysilicon ($Cl_2$/He). The size of the filter exit holes may be two microns. It should be noted that the exit holes do not determine the length or the width of the pores. Both the pore length and width will be determined by the thickness of the thin films 106 and 108.

Filter exit holes 100 are next filled with plugs 104 of a sidewall support sacrificial material 102. Material 102 is chosen such that it can be etched without etching the structural layers 96, 108 (see FIG. 5D) and 114 (see FIG. 5F), and also so that it is not etched rapidly by the etchant used to remove the sacrificial layers 32, 106 (FIG. 5C) and 112 (FIG. 5F). A suitable material is silicon nitride. Sufficient sidewall support sacrificial material is deposited to fill holes 100 and form a planar top surface 101, resulting in the structure of FIG. 5A. The silicon nitride may be deposited by CVD (850° C., ammonia, and dichlorosilane).

The top layer or planar top surface of sidewall support sacrificial material 102 is then etched back, down to the top of the sidewall clearance sacrificial layer 98, as shown in FIG. 5B. A portion of the sidewalls of plugs 104 are then exposed by completely etching sidewall clearance sacrificial layer 98 with HF, to obtain a structure where the top surface of the first structural layer 96 is exposed (FIG. 5C).

The pore sacrificial layer 106 separating the first structural layer 96 from the second structural layer 108 that is to be deposited later (see FIG. 5D), is grown next on the top surface of the first structural layer. As discussed above, in the case of a silicon first structural layer, this may be done by thermally oxidizing it. The resulting pore sacrificial layer 106 is shown in FIG. 5C. The thickness of layer 106 determines the width W of the pores of the resulting filter 111 (FIG. 5G). Openings (not shown) are etched through this layer at the locations where the second structural layer is to be anchored to the first structural layer 96.

The second structural layer 108, whose thickness determines the length L of the resulting pores, is deposited next. Good uniform coverage of the sidewalls of plugs 104 is required. The second structural layer may be about 500 to 3000 angstroms of LPCVD amorphous silicon. The resulting structure is shown in FIG. 5D. The horizontal parts of this layer are next removed by an anisotropic etch, leaving only the vertical sidewalls 110 shown in FIG. 5E.

A third structural layer 114 is required to seal the tops of plugs 104. This third layer should not be deposited directly on the pore sacrificial layer 106 because doing so would increase the length of the pores beyond the thickness of second structural layer sidewalls 110. An entrance hole sacrificial layer 112 (FIG. 5F) that covers the base of sidewalls 110 and leaves exposed the upper part of sidewalls 110 and plugs 104 may be provided by growing a relatively thick (for example 4 microns) layer of LTO (not shown) and then etching it back using, for example, 5% HF to expose the upper part of sidewalls 110 and plugs 104.

The third structural layer 114 may now be grown to seal the tops of plugs 104, and patterned to provide entrance holes 116. The resulting structure is shown in FIG. 5F. If necessary, the structure may be annealed to reduce internal stress before etching the sacrificial layers 112, 106, 104, and 32. The sacrificial layers may then be etched to obtain the finished filter. For the materials used in this example, a wet etch using concentrated (49%) HF may be used. The silicon dioxide is etched rapidly. Silicon nitride plugs 104 are etched more slowly.

The result is a filter 111 with very short, well controlled, pore lengths, shown in FIG. 5G, with arrow 118 indicating the path through a pore. The width W and length L of the pores may be about 50 angstroms or greater and about 500 angstroms or greater, respectively.

The present invention also allows fabrication of filters having discrete pores held in a polymer matrix. Such filters are useful for flexible filters that are required to conform in contact with curved bodies. A plan view of such a filter 121 is shown in FIG. 6A, with a cross-sectional view in FIG. 6B. Filter 121 comprises a plurality of separate islands 120, each having a pore 122. Islands 120 are held in a polymer matrix 124. It should be noted that islands having more than one pore each would also be within the scope of the present invention. Islands 120 with pores 122 may be produced using any of the methods described above or variations thereof, for example, by introducing additional processing steps and postponing the final etching of the sacrificial layers or even the patterning of the top structural layer to provide entrance holes for the pores.

As is shown in the structure of FIG. 6C, the filter structure may be formed on a substrate 34 coated with a sacrificial layer 32, as previously discussed. This sacrificial layer holds a filter structure that has been patterned into islands 120 by etching trenches 126. Next, the polymer for matrix 124 may be applied and cured. Polymer matrix 124 may consist of polyimide, and be applied using a wafer spinner. Entrance holes 127 are then photolithographically patterned in polymer matrix 124 with the resulting structure shown in FIG. 6D.

The standard filter fabrication steps that have been postponed, as discussed above, are then carried out. These steps may consist of the etching of entrance holes in the top structural layer of the filter, and the final etch of the sacrificial layers, including layer 32, resulting in the opening of pores 122 and the separation of the filter structure from substrate 34. Filter 121 of FIGS. 6C and 6D is thus obtained. The width and length (not shown) of the pores depend on the details of fabrication of the filter pores, which, as discussed, may be fabricated by any of the methods described above or variations thereof.

In all the filter fabrication processes described above, the structural layers forming the walls of the pores are anchored to each other by direct bonding through holes that had been etched through the pore sacrificial layers. If the structural layers are conductive to allow control of the electrical potential at the pore walls, the potential may be held constant everywhere on the pore walls. For some applications, such as the liquid crystal valves described below, it is desirable to apply a potential difference between two different and conductive walls of the same pore. For other applications, such as the molecular coating crystallization valves described below, it is desirable to control the temperature of individual pores or of the filter as a whole, for example, by ohmic heating. To make this possible, it is necessary in some cases to bond two conductive structural layers to each other without electrical contact, by means of an insulating film.

The most general method to achieve this is to apply an insulating film before or after the growth and patterning of the pore sacrificial layer, and pattern the insulating film into pads extending over the areas of the anchoring holes of the pore sacrificial layer. However, in the case of pore sacrificial layers grown by a chemical reaction at the exposed surface of a conductive structural layer film, such as the oxidizing of silicon, a self-aligned process using only one patterning step is possible. Such a process is illustrated in FIGS. 7A–7E, which are sectional views through the structural layer anchoring structures at successive stages of filter fabrication. As such, the figures do not show the entrance holes of the filter, as these holes are not in the plane of the section.

Fabrication may begin with a substrate 34 covered with a sacrificial layer 32. A first structural layer 128 of a material allowing growth of sacrificial layers by surface reaction, as described above, is then grown. Layer 128 may be 2 microns of amorphous silicon grown by LPCVD. This film is patterned and covered, by deposition and patterning, with pads 130 of an insulating material at those locations where a subsequent structural layer is to be anchored to first structural layer 128. In the process described in FIGS. 7A–7E, pads 130 are provided before first structural layer 128 is patterned, as shown in FIG. 7A. This order may be preferable when pads 130 are only on the top surface of layer 128. If pads 130 are to cover any sidewalls of layer 128 after it is patterned, layer 128 would have to be patterned first. The result of these patterning steps, shown in FIG. 7B, is a patterned first structural layer 128 partially covered with pads 130. By way of example, pads 130 may be one micron thick, and consist of sputtered alumina, or silicon nitride (both of these are soluble in HF, but slower than silicon dioxide.

The pore sacrificial layer 132 is grown next, by a surface reaction of first structural layer 128, such as thermal oxidation of silicon. As shown in FIG. 7C, layer 132 grows only on the exposed surface of structural layer 128, to a thickness equal to the desired pore clearance, for example, 100 angstroms. As a result, a subsequent structural layer 134 (FIG. 7D) bonded to pads 130 will be anchored to first structural layer 128 by means of layer 130, even after pore sacrificial layer 132 is etched. This subsequent structural layer will also be electrically insulated from first structural layer 128 because layer 130 is electrically insulating. This subsequent structural layer may be a second 2 micron layer of LPCVD amorphous silicon 134, shown in FIG. 7D.

After entrance holes (not shown) are etched into layer 134, sacrificial layers 132 and 32 are etched to obtain filter 136 shown in FIG. 7E. This filter is similar to filter 89 of FIG. 3E, but in filter 136, structural layers 134 and 128 are not in direct contact, and are electrically isolated from each other.

The conductance of the structural layers of filters that are to be electrically biased may be improved by metallization. Metallization 145 (see FIGS. 8A–8D) may be applied to one or both sides of a filter structure and patterned by etching or by photoresist lift-off as known in the art, resulting in a wide variety of configurations, some of which are schematically shown in FIGS. 8A–8D. The filter 141 of FIG. 8A is formed of a first structural layer 138 and a second structural layer 140. The pore walls formed of layer 138 are electrically floating, and layer 140 is metallized on both sides of the filter with metal layer 145, with the lower surface 140b completely covered with metal and the upper surface 140a only partly covered.

The filter 142 of FIG. 8B has straight-through pores 139, formed of a structural layer 138 metallized on the lower surface of the filter and another structural layer 140 metallized on the upper surface of the filter. Filter 144 of FIG. 8D is similar to filter 142 of FIG. 8B, but with longer pores. The filter 143 of FIG. 8C also has long pores 139 which, however, are not straight-through, with both structural layers partly metallized, one on each side of the filter.

The metallization on the lower side of the filter may be patterned by lift-off, as is well known in the art. This requires several processing steps such as photoresist spinning, exposure and photoresist development, during which the filter must be kept on a macroscopic substrate with the lower filter surface exposed. As shown in FIGS. 9A–9G, this may be done by attaching a top side 146 of a filter 148 to a plate 150, such as a transfer wafer, coated with an adhesive 152, such as wax. This step is carried out while filter 148 is still bonded to its substrate 34 by means of sacrificial layer 32. The resulting structure is shown in FIG. 9B. The sacrificial layers, including layer 32 and the pore sacrificial layers (not shown), are then etched such that filter 148 is separated from substrate 34 and remains attached to plate 150, as shown in FIG. 9C. At this point, the filter structure may be processed by patterning, metallization and lift-off as known in the art.

A layer of photoresist 154 may be applied and patterned as required for metal lift-off resulting in the structure of FIG. 9D. As shown in FIG. 9E, a metal film 156 is deposited on the bottom surface of filter 148. As is known, the photoresist 154 and the metal film on its surface may be removed as shown in FIG. 9F. Finally, wax 152 is dissolved to detach filter 148 from plate 150. The metallized filter 155 of FIG. 9G is thus produced.

The surface of the filters of the present invention can be given various chemical properties depending on the application. For example, the filters can be hydrophillic or hydrophobic. A hydrophyllic surface is useful for aqueous solutions, and a hydrophobic surface is useful when filtering nonpolar hydrocarbons. A hydrophobic filter with pores less than 3000 angstroms is useful for humidity control as liquid water cannot pass through it, but water vapor can. The filters can also be made to strongly adsorb certain types of molecules by bonding on the surface monoclonal antibodies. The antibodies would have to be bonded at a part of the antibody that does not interfere with its ability to recognize and adsorb the desired target molecules.

Chemical coatings that provide the desired properties may be bonded covalently, so they are essentially permanently attached. In the case of silicon, a coupling agent conforming to the generic formula $(RO)_3Si(CH_2)_3X$ can be used. In this generic formula, the R represents any alkyl group, usually ethyl ($C_2H_5$—) and the X represents a reactive end group, usually amine (—$NH_2$). The surface of a polysilicon filter in accordance with the present invention may be covered by a layer of —OH groups (hydroxyl groups) due to exposure to air and humidity. The hyphen indicates the covalent bond between the oxygen and a silicon atom of the filter. The silicon atom of the coupling agent displaces the hydrogen atom and bonds to the oxygen atom while the H atom bonds to the oxygen atom of the RO— group to make ROH which is a stable alcohol (such as ethanol) which diffuses away. At this point a second chemical species may be brought in such that one end reacts with the unbound end of the coupling agent and the other end presents the desired chemical interface to the environment. Typical reagents used include glutaraldehyde (which can be attached to a large class of biologically active proteins). Any molecule onto which a group may be attached that reacts with the end of the coupling agent may be used. In the case where the end of the coupling agent is a primary amine (—$NH_2$), a thiol (—SH) group may be used to attach a molecule to the coupling agent. This reaction gives off ammonia ($NH_3$) and forms a carbon-sulfur bond between the coupling agent and the second molecule.

There are many inorganic materials beside silicon that form a layer of —OH groups on their outer surfaces on exposure to air with water vapor present. These materials include metals, ceramics and semiconductors. Thus, the foregoing is a general strategy widely used to attach desired molecules to an inorganic surface.

As is known in the art, functional chemical monolayers may be bonded to inorganic surfaces by exposure to UV radiation, or by heat. In both cases, a reactive end group experiences bond breakage which provides a highly reactive radical state. From this excited state a new covalent bond is formed between the molecule and the inorganic substrate. There is a wide variety of reactive end groups that can be used. In this way virtually any chemical surface properties can be applied to the inorganic structure.

Long chain alkane molecules with a reactive end group, such as carboxylic acid, bind at the reactive end group to silicon pore walls. The alkane molecules may be straight chains as shown schematically in FIG. 10A, where pore walls 158 and 160 are coated with molecules 162. As shown schematically in FIG. 10B, branched molecules 164 may be used instead of straight chain molecules 162. The alkane molecules would make the pore hydrophobic and increase its selectivity to nonpolar species. Chemically functional groups can be added to the chains to make them more or less hydrophillic, or oleophillic, or interactive with very specific molecules. The straight chain molecular coating can effectively crystallize below a specific freezing point. This would stop further flow through the pore. Thus, a molecular crystallization valve can be formed by heating the pore above the melting point to permit flow and cooling it below the freezing point to stop flow. The branched molecules would crystallize only at very low temperatures.

A liquid crystal valve 170 can be produced, as shown in FIGS. 11A and 11B, by coating the pore walls 158 and 160 with highly polarizable molecules such as liquid crystal or similar molecules 166 and providing means, such as metal lines 168, to apply an electric field across the pore. When an electric field is applied across the pore, molecules 166 straighten and shut off the flow through the pore (FIG. 11B).

It should be noted that the pore size of the filters of the present invention may be easily modified by thin film growth techniques such as chemical vapor deposition of additional material on the pore walls to make the pores smaller, or oxidation of pore walls followed by oxide etching to make the pores larger. The pores can also be made smaller by growing thermal oxide on them (e.g., dry oxidation at 800° C.) which is a precisely controllable process. The filters of the present invention can also be easily integrated with other microfabricated electronic, mechanical, or electromechanical devices. The constituent materials, pore dimensions and pore shapes can also be varied widely.

FIG. 12 is a view of a filter structure 172 after fabrication and removal from the wafer that it was formed on. Filter membrane 174 may be fabricated according to any one of the methods described above. Membrane 174 is supported by a continuous stiffening rib 176 extending around membrane's periphery and by ribs 178 extending across the membrane. Ribs 176 and 178 may be fabricated as shown in FIGS. 1A–1H for rib 30. As indicated by arrow A in the direction of flow through the filter, the ribs are typically, but not necessarily, on the downstream side of the membrane. Typical dimensions would be a filter membrane diameter D of about 1 to 3 mm and stiffening rib height H of about 0.01 mm to 0.25 mm depending on the pressure that may occur in the particular application.

For high diffusivity applications, pore lengths of about 500 angstroms to 3000 angstroms would be used. Pore lengths of 0.5 to 20 microns would be used for chromatography and timed release of chemicals. The widths of the pores may be about 50 angstroms or larger, depending on the size of the species that is to be passed through the filter.

As shown in FIG. 13, filter 172 may be sealed in a glass tube 180, such as Corning #7740 glass. Sealing is carried out by inserting filter 172 into tube 180 and then rotating the tube in a small sharp flame which heats the glass in the area of the filter rim 176. The temperature exceeds the softening point of the glass, and surface tension makes it bulge in to contact and bond to the filter rim. The resulting assembly 181 may then be annealed at the glass annealing temperature of about 555° C. for about 12 hours to relieve stress in the glass. The glass should form a strong hermetic seal to silicon, and have a thermal coefficient of expansion close to that of silicon. This unit can now be used in the laboratory by attaching plastic tubing to the ends of the glass tubing. Instead of glass, teflon, polypropylene, or many other materials could be used to house the filter if it is appropriate for a particular application. When the diameter of the attaching tubing 184 (FIG. 14) is smaller than that of the filter, tubing or syringe fittings 182 with hose barb ribs 186 may be used instead of glass tube 180, as shown in FIG. 14.

In summary, microfabricated particle filters with well defined pore shapes and methods for their fabrication have been described.

The present invention has been described in terms of several preferred embodiments. The invention, however, is not limited to the embodiments depicted and described. Rather, the scope of the invention is defined by the appended claims.

What is claimed is:

1. A method for fabricating a filter having pores with short pore lengths, comprising:
    forming a first structural layer over a sacrificial top layer of a substrate;
    forming a sidewall support sacrificial layer having substantially vertical sidewalls;
    forming a pore sacrificial layer whose thickness defines a width of said pores;
    forming a second structural layer covering the vertical sidewalls of said sidewall support sacrificial layer, a thickness of said second structural layer defining a length of said pores;
    anisotropically etching said second structural layer to remove its horizontal portions;
    forming an entrance hole sacrificial layer covering a bottom portion of said second structural layer and leaving exposed a top portion of said second structural layer;
    forming a third structural layer;
    etching entrance holes in said third structural layer; and
    etching all of said sacrificial layers.

2. The method of claim 1 wherein said pore sacrificial layer is formed after etching exit holes in said first structural layer and forming said sidewall support sacrificial layer.

3. A method for fabricating a filter, the method comprising:
    forming a first thin film structure having openings therethrough, including forming a reinforcing rib in a trench in a substrate adjacent to said first film structure;
    forming a sacrificial layer over at least part of said first thin film structure;
    forming a second thin film structure over said first thin film structure and said sacrificial layer, said sacrificial layer and said second thin film structure blocking said openings of said first thin film structure, and said second thin film structure having second openings therethrough, said second openings exposing a portion of said sacrificial layer; and
    etching said sacrificial layer such that said sacrificial layer no longer blocks said openings of said first thin film structure.

4. The method of claim 3 wherein said first thin film structure is grown by chemical vapor deposition.

5. A method for fabricating a filter, the method comprising:
    providing a first thin film structure having openings therethrough;
    forming a sacrificial layer over at least part of said first thin film structure;
    forming a second thin film structure by chemical vapor deposition over said first thin film structure and said sacrificial layer, said sacrificial layer and said second thin film structure blocking said openings in said first thin film structure, and said second thin film structure having second openings therethrough, said second openings exposing a portion of said sacrificial layer; and
    etching said sacrificial layer such that said sacrificial layer no longer blocks said openings in said first thin film structure.

6. The method of claim 5 wherein said step of forming said second thin film structure includes etching back said second thin film structure without patterning.

7. The method of claim 6 wherein said first and second thin film structures define an exposed surface and further including:
    after forming said second thin film structure and before etching said sacrificial layer, doping the exposed surface of said first and second thin film structures with boron; and
    after etching said sacrificial layer, partially etching an undoped portion of said first and second thin film structures; and wherein
    said first and second thin film structures include silicon.

8. A method for fabricating a filter, the method comprising:
    providing a first thin film structure having openings therethrough;
    forming a sacrificial layer over at least part of said first thin film structure, including a step of etching anchoring holes in said sacrificial layer to expose said first thin film structure;
    at least partially etching through said first thin film structure where it is exposed by said anchoring holes;
    forming a second thin film structure over said first thin film structure and said sacrificial layer, said sacrificial layer and said second thin film structure blocking said openings in said first thin film structure, and said second thin film structure having second openings therethrough, said second openings exposing a portion of said sacrificial layer; and etching said sacrificial layer such that said sacrificial layer no longer blocks said openings in said first thin film structure.

9. The method of claim 8, wherein said etching of said first thin film structure comprises etching completely through said first thin structure, and further including partially etching underneath said first thin film structure where it is exposed by said anchoring holes to provide a space for a rivet-like shape of said second thin film structure.

10. A method for fabricating a filter, the method comprising:

providing a first thin film structure having openings therethrough;

forming a sacrificial layer over at least part of said first thin film structure;

forming a second thin film structure over said first thin film structure and said sacrificial layer, said sacrificial layer and said second thin film structure blocking said openings in said first thin film structure, and said second thin film structure having second openings therethrough, said second openings exposing a portion of said sacrificial layer;

etching trenches through said first and second thin film structures to form filter islands;

applying a polymer matrix on said second thin film structure and in said trenches;

curing said polymer matrix;

patterning entrance holes in said polymer matrix; and etching said sacrificial layer such that said sacrificial layer no longer blocks said openings in said first thin film structure.

* * * * *